United States Patent
Schwarz et al.

(10) Patent No.: US 11,915,381 B2
(45) Date of Patent: Feb. 27, 2024

(54) METHOD, DEVICE AND COMPUTER PROGRAM FOR VIRTUALLY ADJUSTING A SPECTACLE FRAME

(71) Applicants: Carl Zeiss AG, Oberkochen (DE); Carl Zeiss Vision International GmbH, Aalen (DE)

(72) Inventors: Oliver Schwarz, Ellwangen (DE); Ivo Ihrke, Adelmannsfelden (DE)

(73) Assignees: Carl Zeiss AG, Oberkochen (DE); Carl Zeiss Vision International GmbH, Aalen (DE)

( * ) Notice: Subject to any disclaimer, the term of this patent is extended or adjusted under 35 U.S.C. 154(b) by 89 days.

(21) Appl. No.: 16/731,402

(22) Filed: Dec. 31, 2019

(65) Prior Publication Data
US 2020/0233239 A1 Jul. 23, 2020

Related U.S. Application Data

(63) Continuation of application No. PCT/EP2018/067914, filed on Jul. 3, 2018.

(30) Foreign Application Priority Data

Jul. 6, 2017 (EP) ..................... 17179990

(51) Int. Cl.
*G06T 19/20* (2011.01)
*G02C 13/00* (2006.01)
(Continued)

(52) U.S. Cl.
CPC ............ *G06T 19/20* (2013.01); *G02C 13/005* (2013.01); *G06Q 30/0621* (2013.01);
(Continued)

(58) Field of Classification Search
None
See application file for complete search history.

(56) References Cited

U.S. PATENT DOCUMENTS 6,792,401 B1 9/2004 Nigro et al.
8,733,936 B1 5/2014 Kornilov et al.
(Continued)

FOREIGN PATENT DOCUMENTS

| CA | 2884576 A1 | 3/2014 |
| CN | 103842894 A | 6/2014 |
| CN | 104168817 A | 11/2014 |
| CN | 105992966 A | 10/2016 |
| EP | 3354190 A1 | 8/2018 |
| EP | 3355100 A1 | 8/2018 |

(Continued)

OTHER PUBLICATIONS

Pedro Azevedo, Thiago Oliveira dos Santos, Edilson de Aguiar, "An Augmented Reality Virtual Glasses Try-On System", Jun. 24, 2016, IEEE, 2016 XVIII Symposium on Virtual and Augmented Reality (SVR), pp. 1-9.*

(Continued)

*Primary Examiner* — Robert Bader
(74) *Attorney, Agent, or Firm* — Tautz & Schuhmacher LLC; Georg Hasselmann

(57) ABSTRACT

A method for virtual spectacle adjustment and a corresponding computer program and computing device are disclosed. First measurement points are defined on a 3D model of a person's head, and a model of a frame is adjusted on the basis of the first measurement points. Defining the first measurement points includes defining second measurement points on a parametric head model, adjusting the parametric head model to the 3D model of the person's head, and determining the first measurement points on the basis of the second measurement points and the adjustment. In this way, the second measurement points only have to be defined once (Continued)

on the parametric model so that the first measurement points can be defined for a plurality of different 3D models of different heads.

32 Claims, 12 Drawing Sheets

(51) Int. Cl.
   *G06Q 30/0601* (2023.01)
   *G06N 20/00* (2019.01)
   *G06F 17/17* (2006.01)
(52) U.S. Cl.
   CPC ..... *G06Q 30/0623* (2013.01); *G06Q 30/0633* (2013.01); *G06Q 30/0643* (2013.01); *G06F 17/17* (2013.01); *G06N 20/00* (2019.01); *G06T 2219/2004* (2013.01); *G06T 2219/2021* (2013.01)

(56) References Cited

U.S. PATENT DOCUMENTS

| | | | |
|---|---|---|---|
| 9,262,695 | B2 | 2/2016 | Choukroun et al. |
| 9,286,715 | B2 | 3/2016 | Coon et al. |
| 9,589,340 | B2 | 3/2017 | Guerin |
| 9,703,123 | B2 | 7/2017 | Fonte et al. |
| 10,036,902 | B2 | 7/2018 | Baranton et al. |
| 10,108,028 | B2 | 10/2018 | Rego et al. |
| 2002/0015530 | A1 | 2/2002 | Henry et al. |
| 2002/0105530 | A1 | 8/2002 | Waupotitsch et al. |
| 2003/0123026 | A1 | 7/2003 | Abitbol et al. |
| 2005/0162419 | A1 | 7/2005 | Kim et al. |
| 2013/0088490 | A1 | 4/2013 | Rasmussen et al. |
| 2013/0188128 | A1 | 7/2013 | Fabien et al. |
| 2013/0321412 | A1* | 12/2013 | Coon ................ G06T 17/00 345/420 |
| 2014/0043329 | A1* | 2/2014 | Wang ............... G06K 9/00201 345/420 |
| 2014/0160123 | A1* | 6/2014 | Yang ................ G06T 17/00 345/420 |
| 2015/0015848 | A1 | 1/2015 | Haddadi et al. |
| 2015/0055085 | A1 | 2/2015 | Fonte et al. |
| 2015/0243015 | A1 | 8/2015 | Guerin |
| 2015/0277155 | A1 | 10/2015 | Raviv |
| 2015/0293382 | A1 | 10/2015 | Jethmalani et al. |
| 2016/0062152 | A1 | 3/2016 | Fonte et al. |
| 2016/0246078 | A1* | 8/2016 | Choukroun ............ G06T 5/00 |
| 2016/0299360 | A1 | 10/2016 | Fonte et al. |
| 2016/0327811 | A1 | 11/2016 | Haddadi et al. |
| 2019/0346698 | A1 | 11/2019 | Nieuwenhuis et al. |

FOREIGN PATENT DOCUMENTS

| | | | |
|---|---|---|---|
| EP | 3355102 | A1 | 8/2018 |
| EP | 3410178 | A1 | 12/2018 |
| FR | 2971873 | A1 | 8/2012 |
| FR | 3016051 | A1 | 7/2015 |
| FR | 3016052 | A1 | 7/2015 |
| FR | 3021205 | A1 | 11/2015 |
| JP | 06118349 | A | 4/1994 |
| JP | 2011060100 | A | 3/2011 |
| JP | 2013008137 | A | 1/2013 |
| WO | 03081536 | A1 | 10/2003 |
| WO | 2013177456 | A1 | 11/2013 |
| WO | 2014037915 | A1 | 3/2014 |
| WO | 2016164859 | A1 | 10/2016 |

OTHER PUBLICATIONS

Volker Blanz, "A Learning-Based High-Level Human Computer Interface for Face Modeling and Animation", 2007, Springer, Artificial Intelligence for Human Computing pp. 296-315.*
Michael Zollhofer, Michael Martinek, Gunther Greiner, Marc Stamminger, Jochen Sußmuth, "Automatic reconstruction of personalized avatars from 3D face scans", Apr. 12, 2011, Wiley, Computer Animation and Virtual Worlds 2011, issue 22, pp. 195-202.*
David C. Schneider, Peter Eisert, "Fitting a Morphable Model to Pose and Shape of a Point Cloud", Nov. 18, 2009, Proceedings of the Vision, Modeling, and Visualization Workshop 2009.*
Trina Russ, Chris Boehnen, Tanya Peters, "3D Face Recognition Using 3D Alignment for PCA", 2006, IEEE, Proceedings of the 2006 IEEE Computer Society Conference on Computer Vision and Pattern Recognition (CVPR'06).*
"Ophthalmic optics—Spectacle frames—List of equivalent terms and vocabulary" DIN ISO 77998:2006-01 , Jan. 2006.
"Ophthalmic optics—Spectacle lenses—Vocabulary" (ISO 13666:2012); German and English version EN ISO 13666:2012, Oct. 2013.
"Ophthalmic optics—Spectacle frames—Measuring system and terminology" DIN EN ISO 8624:2015-12, Dec. 2015.
Booth et al.: "A 3D Morphable Model Learnt from 10,000 Faces," 2016 IEEE Conference on Computer Vision and Pattern Recognition (CVPR), Las Vegas, NV, pp. 5543-5552, doi:10.1109/CVPR. 2016.598, 2016.
Brunton et al.: "Review of Statistical Shape Spaces for 3D Data with Comparative Analysis for Human Faces," Computer Vision and Image Understanding, 128:1-17, 2014.
Demonstration video for "Vacker" software by VOLUMENTAL (two screenshots), available at the url: "www.volumental.com/face-scanning/," last accessed of Mar. 5, 2017.
Eber, "Anatomische Brillenanpassung [Anatomical Spectacles Adjustment]", DOZ, Verlag Optische Fachveröffentlichung GmbH, p. 23 pp., (relevance found in paragraphs [0111], 0122], and [0178] of the instant specification, 1987.
Hartley et al.: "Multiple View Geometry in Computer Vision," 2nd edition, pp. 1 to 8, Cambridge University Press 2004.
Hirschmüller et al.: "Stereo Processing by Semiglobal Matching and Mutual Information," in IEEE Transactions on Pattern Analysis and Machine Intelligence, vol. 30, No. 2, pp. 328-341, doi: 10.1109/ TPAMI.2007.1166, Feb. 2008.
Internet citation Attribut (Objekt) [Attribute (Object)], German Wikipedia article, last accessed Nov. 5, 2019.
Internet article: "Ausgleichsrechnung [Curve fitting]," German Wikipedia article, available at the url: https://de.wikipedia.org/wiki/ Ausgleichungsrechnung, and English-language counterpart article, last accessed Apr. 1, 2020.
Internet article: "Bewegung (Mathematik) [Motion (Geometry)]," German Wikipedia article, available at the url: https://de.wikipedia. org/wiki/Bewegung_(Mathematik), last accessed Apr. 1, 2020.
Internet site: "Cyberware products," available at the url: cyberware. com/products/scanners/ps.html, 1999.
Internet article: "Generatives Fertigungsverfahren (redirects to 3D Druck) [Additive manufacturing method (redirects to 3D prininting)]", German Wikipedia article, last accessed Apr. 1, 2020.
Internet article: "Parser," German Wikipedia article, and English language counterpart, last accessed as of May 19, 2017.
Internet Site: "Polynomial," Wikipedia article, available at the url: en.wikipedia.org/wiki/Polynomial#Definition, last accessed Apr. 1, 2020.
Internet Site: "Resampling and Smoothing Data," available at pointclouds.org/documentation/tutorials/resampling.php, last accessed Apr. 1, 2020.
Internet article: "Spline," the German Wikipedia article, and English-language counterpart site, last accessed Apr. 1, 2020.
Internet site: "3D Shape Products," available at the url: www.3d-shape.com/produkte/face_d.php, last accessed Apr. 1, 2020.
Kazemi et al.: "One millisecond face alignment with an ensemble of regression trees," Proceedings of the IEEE Conference on Computer Vision and Pattern Recognition, 2014.
Niessner et al. "Real-time 3D reconstruction at scale using voxel hashing". ACM Trans. Graph. 32, 6, Article 169, DOI: doi.org/10. 1145/2508363.2508374, Nov. 2013.
Niswar et al.: "Virtual Try-On of Eyeglasses using 3D-Model of the Head," Institute for Infocomm Research, DOI:10.1145/2087756. 2087838, Dec. 2011.
Rau et al.: "A Semi-Automatic Image-Based Close Range 3D Modeling Pipeline Using a Multi-Camera Configuration," Sensors (Basle, Switzerland), 12(8):11271-11293, 2012.

(56) References Cited

OTHER PUBLICATIONS

International Search Report and English-language translation thereof issued in PCT/EP2018/067914, which is a counterpart hereof, dated Oct. 9, 2018.
International Preliminary Report on Patentability issued in PCT/EP2018/067914, which is a counterpart hereof, completed Jul. 3, 2019.
Blanz et al. "A Morphable Model for the synthesis of 3D faces," SIGGRAPH '99: Proceedings of the 26th annual conference on computer graphics and interactive techniques, pp. 187 to 194, Jul. 1999.
Whitmarsh et al. "Landmark Detection on 3D Face Scans by Facial Model Registration," 1st International symposium on shapes and semantics, pp. 71-75, 2006.
Office action by the Japanese Patent Office issued in JP2020-500077, which is a counterpart hereof, dated Jun. 25, 2020, and English-language translation thereof.
Notice of Opposition before the European Patent Office, submitted in EP 17179990.1, which is a counterpart hereof, dated Aug. 21, 2020.
Tseng et al.: "Parametric Modeling of 3D Human Faces using Anthropometric Data," Proceedings of the 2014 IEEE IEEM, 2014.
Office action by the Indian Patent Office issued in Indian patent application IN202047003540, which is a counterpart hereof, dated May 25, 2021 (In English and Hindi).
Summons to attend oral proceedings pursuant to Rule 115(1) EPC for European patent application EP17179990.1, which is a counterpart hereof, mailed Jun. 25, 2021, and English-language translation thereof.
Office action by the Canadian Patent Office issued in Canadian patent application CA 3,072,117, which is a counterpart hereof, dated Jun. 30, 2021 (In English).
Office action by the Chinese Patent Office issued in CN201880057588.0, which is a counterpart hereof, dated May 14, 2021, and English-language translation thereof.
Office action by the Chinese Patent Office issued in CN201880057588.0, which is a counterpart hereof, dated Aug. 12, 2021, and English-language translation thereof.
Search Report issued by the Japanese Patent Office in Japanese patent application JP 2021-023465, which is a counterpart thereof, dated Mar. 18, 2022, and English-language translation thereof.
Office Action by the Chinese Patent Office in CN 202111429388.3, which is a counterpart hereof, dated Aug. 24, 2023, and English-language translations thereof.
Decision to reject opposition issued by the European Patent Office in European patent application EP 17 179 990.1, which is a counterpart hereof, mailed May 4, 2022, and English-language machine translation thereof.

\* cited by examiner

METHOD, DEVICE AND COMPUTER PROGRAM FOR VIRTUALLY ADJUSTING A SPECTACLE FRAME

CROSS REFERENCE TO RELATED APPLICATIONS

This application is a continuation application of international patent application PCT/EP2018/067914, filed Jul. 3, 2018, designating the United States and claiming priority from European application 17179990.1, filed Jul. 6, 2017, and the entire content of both applications is incorporated herein by reference.

TECHNICAL FIELD

The present application relates to methods, apparatuses and computer programs for virtual fitting of spectacle frames.

BACKGROUND

Here, pursuant to DIN ESO 77998:2006-01 and DIN ESO 8624:2015-12, a spectacle frame should be understood to mean a frame or a holder by means of which spectacle lenses can be worn on the head. In particular, the term as used herein also includes rimless spectacle frames. Colloquially, spectacle frames are also referred to as frames. Within the scope of the present application, virtual donning of a spectacle frame denotes fitting a model of a spectacle frame to a model of a head on a computing device, usually connected with a graphical representation of the fitting of the spectacle frame to a head of a person on a display, for example a computer monitor.

Virtual donning of a spectacle frame on a head is known from US 2003/0123026 A1 or US 2002/0015530 A1, for example. In these documents, virtual donning of the spectacle frame predominantly serves to help a user to choose between different spectacle frames by virtue of a graphic representation of the head of the user being displayed together with the spectacle frame.

U.S. Pat. No. 9,286,715 B2, too, discloses a method for a virtual try-on of a pair of spectacles. Here, a plurality of points are defined, both on a spectacle frame and on a head. The spectacle frame is positioned on the head by virtue of selected points on the spectacle frame being brought into correspondence with selected points on the head. A position is changed by changing the selected points. This facilitates positioning with an accuracy that is sufficient for the purpose of U.S. Pat. No. 9,286,715 B2 of providing a virtual try-on for the purposes of obtaining a visual impression. Similarly, US 2005/0162419 A describes virtual donning of a spectacle frame with the aid of feature points. In this document, a frame is initially scaled and then positioned in different directions. Finally, earpieces of the spectacle frame are rotated about two spatial axes.

Volumental has made available a demonstration video for "Vacker" software at "www.volumental.com/face-scanning/", as of Mar. 5, 2017, in which a head with a donned pair of spectacles is presented and parameters of the pair of spectacles are modifiable by means of sliders, for example the seat of the pair of spectacles on the nose bridge, or else other parameters such as face form angle. A color of the spectacle frame or a color of the hinge of the spectacle frame can also be selected. The selected parameters are then output. In this video, different parameters of a parametric model of a spectacle frame are also adapted.

A further system for virtually fitting a pair of spectacles is known from US 2015/0055085 A1. Here, the pair of spectacles is automatically fitted by virtue of the size and fit of the spectacles on the head of a person being adapted. Moreover, form, style, and color of the pair of spectacles can be selected.

A method and an apparatus for constructing a fitted pair of spectacles, i.e., a pair of spectacles that have been fitted to the head of a person, are known from DE 10 2016 824 A1. In this method, head image data are recorded in two or three dimensions, a pair of specimen spectacles is selected and the pair of specimen spectacles is represented on the basis of construction parameters of the pair of specimen spectacles. The construction parameters are determined on the basis of the head image data.

US 2015/0277155 A1 discloses an individualization of the frame of a spectacle frame, within the scope of which distances are measured on the face of a person and the spectacle frame is created means of 3D printing on the basis of the measured distances.

US 2013/0088490 A1 discloses an iterative method for fitting a spectacle frame, wherein the spectacle frame is positioned by way of small steps and fitting is implemented on the basis of a collision detection, in which a check is carried out as to whether the spectacle frame overlaps with the head of the person.

U.S. Pat. No. 8,733,936 B1 discloses a method and a system for fitting a pair of spectacles to a person's head with the aid of image recordings of the head.

WO2014/037915 A1 likewise discloses a method and a system for fitting a pair of spectacles to a person's head, wherein characteristic points are identified in an image of the face of the person to whom the pair of spectacles is intended to be fitted.

Further methods and systems for fitting a pair of spectacles are known from U.S. Pat. No. 9,703,123 B2 or US2016/0062152 A1. fitted to a person's head, for example on the basis of anatomical data input into the system by an operator.

US 2015/0293382 A1 discloses a determination of parameters for a virtual pair of spectacles try-on by means of recordings of a person with a donned exemplary frame. The parameters determined by means of this exemplary frame are modified accordingly for a virtual try-on of a virtual frame. Since the person already wears a spectacle frame during the recording, no three-dimensional model of the head without a spectacle frame is used in this case.

In the article "Virtual Try-On of Eyeglasses using 3D-Model of the Head," Institute for Infocomm Research, December 2011, DOI:10.1145/2087756.2087838, Niswar, Kahn, and Farbiz describe a method for virtual trying on of a pair of spectacles. This is based on four reference points, with two points lying on the nose and two points lying on the ears. Here, a 3D model of the head is adapted by deforming a generic model of the head on the basis of a few feature points.

US 2016/0327811 A1 describes a method that proceeds from a virtual model of a frame. The latter is fitted to a head by deformation. For the purposes of fitting the spectacle frame, fitting criteria can be implemented here, for example a maximization of a contact area between nose pads and the nose of the person, a maximization of a contact area of spectacle earpieces, a centration of a frame rim of the spectacle frame with respect to the eyes, an alignment of the spectacle frame or a minimization of the contact area of the frame rim with the cheekbones of the person and the eyebrows of the person.

Setting target values is specified as a possible extension to these criteria. By way of example, such target values may relate to a distance between the two spectacle earpieces of the spectacle frame, an "as-worn" pantoscopic angle of the frame, a distance between the pads of the frame, a distance of an eye from the spectacle rim, a distance of the spectacle rim from eyebrows and cheekbones, an "as-worn" pantoscopic angle of the spectacle frame or a face form angle of the spectacle frame. These parameters and target values flow into a cost function and an optimization is carried out by means of a conventional optimization process, for example a Levenberg-Marquardt algorithm. Then, the frame can still be deformed.

A problem in this process is that a global optimum need not necessarily be achieved using such an optimization process since optimization methods such as the Levenberg-Marquardt algorithm can generally only find a local minimum of the cost function. In the case of waviness of surfaces in employed 3D models for spectacle frames or the head, the optimization may "get stuck" in such a surface wave far away from the optimum, and hence no optimal fitting is achieved.

Moreover, an optimization by means of such an optimization method requires much computational outlay if many parameters are used. This makes the use of parametric frame models in which a relatively large number of parameters should be optimized more difficult.

In a number of the documents cited above, for example U.S. Pat. No. 9,286,715 B2, US 2005/0162419 A1 or US 2016/0327811 A1, points are marked on the 3D model of the head and then used for the fitting of the model of the spectacle frame, for example points on the nose of the head. These points are essentially assumed to be given. In U.S. Pat. No. 9,286,715 B2, sweeping reference is made to image processing for acquiring these points; US 2016/0327811 A1, too, gives no detailed indications here and refers to a computer-aided determination.

US 2005/0162419 A1 discloses a method for defining points on a head model in which a 2D image of a person is recorded and in which 2D image points are marked. These points are then transferred to a standard head model. A spectacle frame is then fitted on the basis of these points.

Here, too, a user thus has to mark the corresponding points on the respective face of the person, which is time-consuming.

WO 2016/164859 A1 discloses two different possibilities for attaining 3D model of a person's head. In a first procedure, a generic parametric head model is fitted to the person for example on the basis of anatomical parameters input by a user. This fitting can also be done by specific features of the parametric model being brought into correspondence with image recordings of the person. In another procedure, a parametric model is generated anew on the basis of anatomical data of the person. In both cases, the parametric model may be particularly detailed in regions which are relevant to the positioning of spectacle frames. Measurement points which are relevant to fitting the pair of spectacles can likewise be defined here on the basis of image recordings in some other way. Additional image recordings are thus required here.

SUMMARY

It is an object of the present disclosure to provide a method for fitting of a pair of spectacles and also a corresponding computer program and an apparatus, wherein points can be defined on a 3D model of a person's head in an automated manner at least for some of the points, without a user having to mark the points individually on a face or on the model of the head of a person to whom a pair of spectacles is intended to be fitted, and without the need to carry out an analysis of image recordings as in WO2016/164859A1.

This object is achieved by means of a method, a computer program, a computer-readable storage medium, a computer-readable data medium, a data medium signal, and also an apparatus for virtual fitting of a pair of spectacles, as disclosed herein. Further exemplary embodiments are discussed below. A method for producing a spectacle frame that has been fitted with the aid of such methods is additionally provided.

The disclosure provides a computer-implemented method or a method carried out by a computer for virtual fitting of a pair of spectacles, wherein first measurement points are defined on a 3D model of a person's head and wherein a model of a spectacle frame is fitted to the 3D model of the person's head on the basis of the first measurement points. The method is characterized in that defining the first measurement points comprises:

fitting a parametric head model to the 3D model of the person's head, and determining the first measurement points on the basis of second measurement points defined on the parametric head model, and fitting the parametric head model to the 3D model of the head.

Measurement points are understood here generally to mean points on a model which can be used for subsequent fitting of a pair of spectacles, in particular for measuring variables such as distances on the head.

By virtue of this method, the second measurement points on the parametric head model need only be defined once. This parametric head model with the second measurement points defined thereon can then be used for 3D models of the head of different persons in order to define the first measurement points on these 3D models. In contrast to the procedure in WO 2016/164859 A1, therefore, here no images of the person or other items of information are used, and two models are used, namely the parametric head model and the 3D model of the person's head, while only one model is used in WO 2016/164859 A1.

Defining the second measurement points on the parametric head model once as mentioned above can be effected in the context of the above method or else separately and/or beforehand, e.g., on a different computer. Accordingly, the above method can comprise a step of defining the second measurement points on a parametric head model, or the second measurement points can be defined and provided beforehand, e.g., by virtue of the fact that a method comprising the step of defining the second measurement points on a parametric head model is provided separately. The second measurement points can then be used for a multiplicity of different 3D models depending on the person, without the points having to be defined manually, for example, for each 3D model.

The terms used in the method mentioned above and described later are also explained below:

The fitting is "virtual" because the process is carried out on a computing device such as a personal computer (PC) and the real spectacle frame is not placed on the real head.

A model, in particular a 3D model, should be understood to mean a three-dimensional representation of real objects, which are available as a data record in a storage medium, for example a memory of a computer or a data medium. By way of example, such a three-dimensional representation can be a 3D mesh, consisting of a set of 3D points, which are also referred to as vertices, and connections between the points, which connections are also referred to as edges. In the simplest case, this connection form a triangle mesh. Such a representation as a 3D mesh only describes the surface of an object and not the volume. The mesh need not necessarily be closed. Thus, if the head, for example, is described in the form of a mesh, it appears like a mask. Details in respect of such 3D models are found in Rau J-Y, Yeh P-C, "A Semi-Automatic Image-Based Close Range 3D Modeling Pipeline Using a Multi-Camera Configuration." Sensors (Basle, Switzerland). 2012; 12(8):11271-11293. doi:10.3390/s120811271; in particular page 11289, FIG. "FIG. 16".

A voxel grid, which represents a volume-type representation, is a further option for representing a 3D model. Here, the space is divided into small cubes or cuboids, which are referred to as voxels. In the simplest case, the presence or absence of the object to be represented is stored in the form of a binary value (1 or 0) for each voxel. In the case of an edge length of the voxels of 1 mm and a volume of 300 mm×300 mm×300 mm, which represents a typical volume for a head, a total of 27 million such voxels is consequently obtained. Such voxel grids are described in, e.g., M. Nießner, M. Zollhofer, S. Izadi, and M. Stamminger, "Real-time 3D reconstruction at scale using voxel hashing". ACM Trans. Graph. 32, 6, Article 169 (November 2013), DOI: doi.org/10.1145/2508363.2508374.

In particular, the 3D model of the head and/or the 3D model of the spectacle frame can be a 3D model with texture. A 3D model with texture is understood to mean a 3D model which additionally contains the color information items of the surface points of the real object. The use of a 3D model with texture facilitates a true-color representation of the head and the spectacle frame.

Here, the color information item can be contained directly in the vertices as an attribute, for example as an RGB (red green blue) color value, or a pair of texture coordinates is attached to each vertex as an attribute. Vertex denotes a point of the 3D model, as mentioned above. Here, an attribute generally denotes a feature, characteristic or the like, which is assigned to an object, a specific vertex in the present case (see also the German Wikipedia article "Attribut (Objekt)" ["Attribute (Object)"], as of Jul. 5, 2017). Then, these coordinates should be understood to be image coordinates (pixel positions) in an additional texture image. Then, the texture of the aforementioned triangles of the triangle mesh, for example, is generated by interpolation from the pixels of the texture image.

A parametric model is a 3D model having one or more variable parameters. Then, the geometry of the object described by the 3D model, in this case the spectacle frame, changes, e.g., in respect of size or form, by changing the parameter or parameters. Examples of such parameters include, for example, a bridge width or an earpiece length of the spectacle frame, or else a form of a frame rim of the spectacle frame. The type and number of these parameters depend on the spectacle frame represented by the parametric frame model. In particular, a manufacturer of the spectacle frame can set value ranges for the parameters, which then accordingly describe spectacle frames that are able to be manufactured. A free frame parameter is understood to mean a parameter of the parametric frame model, which parameter has not yet been set within the scope of the method, i.e., which parameter must still be fitted and determined.

Fitting guidelines are specifications relating to how the spectacle frame should be positioned relative to regions or points on the head, such as eyes, pupils, eyebrows or nose. These fitting guidelines that are specific to the parametric frame model are used, in particular, to ensure an esthetic impression that is desired by the manufacturer of the spectacle frame. The specific fitting guidelines can be provided together with the parametric frame model in electronic form, for example as appropriate files, by a respective manufacturer.

By contrast, the anatomical fitting relates to fitting that is intended to ensure a correct comfortable fit of the spectacle frame on the head. For this purpose, criteria are used which are not specific to the respective spectacle frame, but rather are generally applicable to a multiplicity of spectacle frames, such as a correct fit of the spectacle earpieces on the ears or a correct fit of nose pads of the pair of spectacles. The anatomical fitting can also comprise ensuring minimum distances to regions of the head, e.g., ensuring a minimum distance between the frame rims of the spectacle frame and the cheekbones and/or an eyebrow section of the head and/or ensuring a minimum distance to the eyelashes. A further example of anatomical fitting lies in the setting of an intended distance or an intended range for the distance between the spectacle lens and the eye, i.e., the vertex distance (German abbreviation HSA). Here, the vertex distance is the distance between the front surface of the cornea of the eye and the surface of the spectacle lens facing the eye. By way of example, anatomical fitting can ensure that an intended vertex distance of 12 mm or a vertex distance ranging from 12 mm to 17 mm is observed. The reason for this is that the spectacle lens should not be placed too close to the eye in order to avoid contacting by the eyelashes and to avoid condensation on the lens (sweating). Moreover, some opticians like to avoid a deviation of the vertex distance from a vertex distance that is preset in a phoropter used to measure the spherocylindrical refraction. Since a relatively large vertex distance modifies the optical power in the direction of positive diopter values, a relatively large vertex distance may possibly be preferred in the case of farsightedness, i.e., when so-called plus lenses are required. Therefore, an intended vertex distance based on the result of the refraction measurement can be used in advantageous fashion.

The fitting guidelines are typically available in text form, for example as a .xml or JSON file, which simplifies processing.

Within the scope of the present application, a "person" denotes the person to whose head the spectacle frame should ultimately be fitted. A "user" denotes a person operating and carrying out the apparatus and the method for fitting spectacles. This may be the person themselves but also someone else, for example an optician.

Suitable parametric head models are described for example in A. Brunton, A. Salazar, T. Bolkart, S. Wuhrer, "Review of Statistical Shape Spaces for 3D Data with Comparative Analysis for Human Faces", Computer Vision and Image Understanding, 128:1-17, 2014, or else a head model as described in J. Booth, A. Roussos, S. Zafeiriou, A. Ponniahy and D. Dunaway, "A 3D Morphable Model Learnt from 10,000 Faces", 2016 IEEE Conference on Computer Vision and Pattern Recognition (CVPR), Las Vegas, Nev., 2016 pages 5543-5552, doi:10.1109/CVPR.2016.598.

Typically, defining second measurement points on the parametric head model is effected by defining the second measurement points on a standard head of the parametric head model, or the second measurement points are defined beforehand on a standard head of the parametric head model.

In this case, a standard head is a head of the parametric head model for which parameters of the parametric head model assume predefined values.

In the case of head models based on a principal component analysis, for example the average value of the data underlying the principal component can be the standard model.

In this way, it is possible to provide a defined starting point for the method.

The features defined on the standard head can then be transferred to the fitted parametric head model in accordance with the fitting, i.e., in accordance with the alteration of the standard head to form the fitted parametric head model, the second measurement points are also altered accordingly, such that they lie at corresponding locations on the fitted head model. In this regard, the second measurement points can be transferred to the fitted head model in a simple manner. Basic principles for such a transfer of points are explained in section 4.1 in the reference J. Booth et al. cited above.

The second measurement points transferred to the second head model can then be used directly as the first measurement points if the fitting of the head model is sufficiently accurate. What is sufficiently accurate depends on a desired accuracy for the subsequent fitting of spectacles and on the accuracy of the measurement system used to create the 3D model of the head. In this regard, by way of example, given an accuracy of the measurement system of 0.2 mm and a desired accuracy of the points of 0.5 mm, with the aid of the fitting of the parametric head model, an accuracy of likewise 0.5 mm would be achieved. If the measurement system has a significantly poorer accuracy, then the distribution of the errors is of importance: in the case of an error with a Gaussian distribution, a smoothing is obtained as a result of the fitting—the accuracy in the sense of the maximum deviation is generally improved by fitting. Alternatively, determining the second measurement points can comprise projecting the transferred measurement points to the 3D model of the head. As a result of such a projection, the first measurement points can then be determined in a simple manner. For projection purposes, a point of intersection of a normal vector on the fitted parametric head model by the respective transferred second measurement point can be used for example as respective first measurement point.

The fitting can be carried out with the aid of conventional fitting algorithms (see the German Wikipedia article "Ausgleichsrechnung" ["Curve fitting"], as of May 22, 2017).

The method can comprise combining a plurality of first measurement points to form a feature identifying a region of the 3D model of the head. With the aid of such features, spectacle frames can then be fitted efficiently if the features identify regions of the 3D model that are relevant to the fitting. Examples of features include for example nose wings, a curvature of the forehead or a base of the ear.

In this case, the combining can comprise fitting a geometric primitive or function to the plurality of measurement points. Examples of such geometric primitives are planes, segments of circles, segments of spheres or cylinders. Examples of functions include spline functions. As a result, a plurality of measurement points can be described with a small number of parameters (for example reference point and normal vector in the case of a plane, radius and midpoint in the case of the curvature of the forehead), which facilitates processing since fewer data are present. The frame model can comprise a parametric frame model.

With the nose wings as a feature, for example a bridge width of the parametric frame model can then be fitted in a simple manner by nose pads of the parametric frame model being brought to congruence with the nose wings. An earpiece length of the parametric frame model can be determined with a point at the base of the ear as measurement point or feature. The pantoscopic angle of the spectacle frame in accordance with DIN EN ISO 13666:2012 5.18, i.e., an inclination of the frame rim, can be determined by determining a distance between the frame rim and a feature describing the cheeks of the 3D model of the person. In this way, various parameters of a parametric frame model can be fitted in a simple manner.

The method can comprise a calculation of further measurement points for the 3D model of the head on the basis of first measurement points or the features explained above. Examples of such calculated further measurement points include a point at the base of the ear from first measurement points in the cheek region and/or first measurement points on the ear. In this case, the point at the base of the ear is a point on which a spectacle earpiece comes to rest during the fitting of the spectacle frame. In other exemplary embodiments, the point at the base of the ear can be one of the first measurement points that are determined on the basis of the second measurement points.

In such a method, a further measurement point like the point at the base of the ear can be calculated even when concealed by hair. In this case, the calculated further measurement point need not necessarily lie on the 3D model, but rather can also be at a distance therefrom.

For calculating a further measurement point, it is possible to use a predefined geometric relationship between first measurement points and such a further measurement point. In this case, a geometric relationship specifies how the further measurement point is situated with respect to the first measurement points. As an example thereof, the calculation of a further measurement point can comprise a linear combination of a set of first measurement points. As a further example, the calculation of a further measurement point can comprise an extrapolation on the basis of the first measurement points. In this case, it is possible to calculate a curve or area model, e.g., a curve or area with one or more free parameters, on the basis of the set of first measurement points by means of interpolation or approximation by means of an error function, for example in that the free parameters are determined by means of a fitting process.

By way of example, a polynomial curve can be fitted to the first measurement points lying on the cheek. In the course of the extrapolation, the polynomial curve is evaluated in the region lying in the direction of the ear and a further measurement point calculated in this way is determined.

Moreover, a computer program comprising a program code which, when executed on a processor, carries out one of the methods described above is also provided. Finally, provision is made of a corresponding apparatus comprising a processor comprising a memory, which stores the computer program, and a processor for executing the computer program.

Provision is also made of a computer program comprising instructions that, upon execution of the program by a computer, cause the latter to carry out the method as described above.

Provision is also made of a computer program comprising instructions that, upon execution of the program by a computer, cause the latter to carry out the following steps:

defining first measurement points on a 3D model of a person's head, wherein measurement points are points on a model which can be used for subsequent fitting of a pair of spectacles, and fitting a model of a spectacle frame to the 3D model of the head on the basis of the first measurement points, characterized in that defining the first measurement points comprises:

fitting a parametric head model to the 3D model of the person's head, and determining the first measurement points on the basis of second measurement points defined on the parametric head model, and fitting the parametric head model to the 3D model of the head.

In addition, further method steps from among those explained above can be carried out.

Provision is also made of an, in particular tangible, computer-readable storage medium comprising instructions that, upon execution by a computer, cause the latter to carry out the method as described above. Examples of storage media comprise optical storage media such as CDs or DVDs, magnetic storage media such as hard disk drives or solid-state storage such as flash memories or read-only memories (ROMs).

Provision is also made of an, in particular tangible, computer-readable storage medium comprising instructions that, upon execution by a computer, cause the latter to carry out the following steps:

defining first measurement points on a 3D model of a person's head, wherein measurement points are points on a model which can be used for subsequent fitting of a pair of spectacles, and fitting a model of a spectacle frame to the 3D model of the head on the basis of the first measurement points, characterized in that defining the first measurement points comprises:

fitting a parametric head model to the 3D model of the person's head, and determining the first measurement points on the basis of second measurement points defined on the parametric head model, and fitting the parametric head model to the 3D model of the head.

In addition, further method steps from among those explained above can be carried out.

Provision is also made of an, in particular tangible, computer-readable data medium, on which the computer program as described above is stored.

Moreover, provision is made of a data medium signal (e.g., via a network such as the Internet), which transmits the computer program as described above.

Provision is also made of an apparatus for data processing and/or for fitting of a pair of spectacles, comprising means for carrying out the method as described above.

Provision is also made of an apparatus for data processing and/or for fitting of a pair of spectacles, comprising:

means for defining first measurement points on a 3D model of a person's head, wherein measurement points are points on a model which can be used for subsequent fitting of a pair of spectacles, and means for fitting a model of a spectacle frame (120) to the 3D model of the head on the basis of the first measurement points, characterized in that the means for defining the first measurement points comprises:

means for fitting a parametric head model to the 3D model of the person's head, and means for determining the first measurement points on the basis of second measurement points defined on the parametric head model, and fitting the parametric head model to the 3D model of the head.

For this purpose, optionally, further means can also additionally be provided for carrying out further steps of the methods described above.

Provision is also made of an apparatus for data processing and/or for fitting of a pair of spectacles, comprising a processor configured to carry out the method as described above.

The computer programs and apparatuses described above can have the same properties as described for the methods.

Moreover, provision is made of a method for producing a spectacle frame, comprising:

carrying out the method as described above, virtual fitting of a spectacle frame to the 3D model of the head using the first measurement points, and producing the fitted spectacle frame.

The 3D model comprising the first measurement points and provided by means of the method as described above is therefore initially used for virtual fitting of a spectacle frame.

Virtual fitting of the spectacle frame per se can be implemented as described in the prior art explained at the outset. Then, the spectacle frame virtually fitted in this way can be produced as a real spectacle frame, as likewise explained in the prior art cited at the outset. Producing can be implemented by means of an additive method such as 3D printing, for example; for an overview in this respect, see the German Wikipedia article "Generatives Fertigungsverfahren" ["Additive manufacturing method"], as of Jun. 25, 2018.

BRIEF DESCRIPTION OF THE DRAWINGS

The disclosure will now be described with reference to the drawings wherein.

DESCRIPTION OF EXEMPLARY EMBODIMENTS

Figure 1:
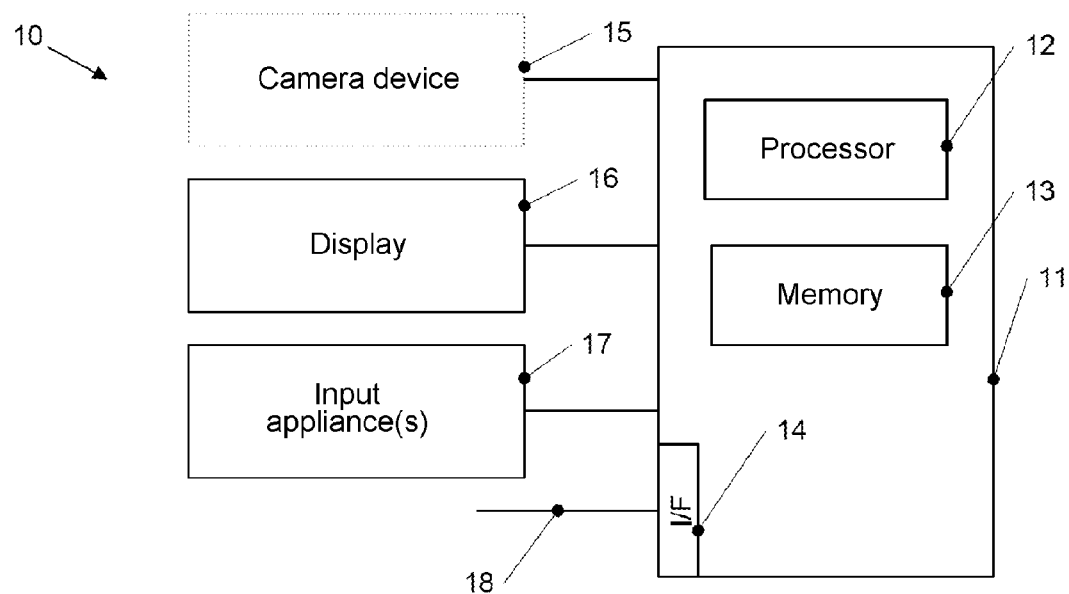
FIG. 1 shows an apparatus for virtual fitting of a pair of spectacles according to one exemplary embodiment.

FIG. 1 shows an exemplary embodiment of an apparatus for virtual fitting of a pair of spectacles according to one exemplary embodiment. The apparatus of FIG. 1 comprises a computing device 11, which comprises a processor 12 and a memory 13. The memory 13 serves to store data and, in the exemplary embodiment of FIG. 1, comprises a random access memory (RAM), a read-only memory (ROM) and one or more mass storage media (hard disk, solid-state disk, optical drive, etc.). A program is stored in the memory 13, the program, when executed on the processor 12, being used to carry out a method for virtual fitting of a pair of spectacles, as already described above or as yet to be explained in more detail below.

The apparatus of FIG. 1 further comprises a display 16 which displays the head of a person together with a spectacle frame when the computer program is executed on the processor 12. User inputs can be implemented by way of one or more input appliances 17, for example keyboard and mouse. Additionally or alternatively, the display 16 can be a touch-sensitive screen (touchscreen) in order to be able to implement inputs.

The apparatus of FIG. 1 furthermore comprises an interface 14 to a network 18, by means of which data can be received. In particular, it is possible to receive here parametric frame models of spectacle frames and associated fitting guidelines from manufacturers of spectacles. In some exemplary embodiments, data are also transmitted to a further computing device via the interface 14 in order to carry out, e.g., a portion of the calculation required for fitting this pair of spectacles. In order to create a 3D model of the head of a person, to which the pair of spectacles should be fitted, the apparatus of FIG. 1 optionally comprises a camera device 15, by means of which a plurality of images of the person can be recorded from different directions and the 3D model can be determined thereby. Information in respect of such a determination of 3D models on the basis of image recordings is found in, e.g., H. Hirschmuller, "Stereo Processing by Semiglobal Matching and Mutual Information" in IEEE Transactions on Pattern Analysis and Machine Intelligence, vol. 30, no. 2, pp. 328-341, February 2008. doi: 10.1109/TPAMI.2007.1166.

Figure 2:
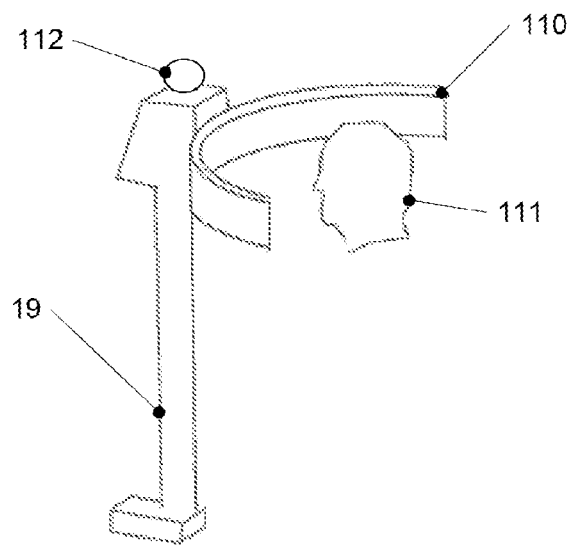
FIG. 2 shows an example of an implementation of a camera device of FIG. 1.

FIG. 2 shows an embodiment for the camera device 15 of FIG. 1. In the exemplary embodiment of FIG. 2, a semicircular arrangement 110 of cameras is fastened to a column 19. A person can then position themselves in such a way that the head 111 of the person, as shown in FIG. 2, is positioned in the semicircular arrangement 110 and can be recorded from different directions. Then, a 3D model of the head 111 can be created therefrom. A texture, i.e., information in respect of colors (as explained above) of the model, also emerges from the image recordings. Moreover, such an apparatus can be used for centration measurements, as described in the European patent application EP 3355100.

Figure 3:
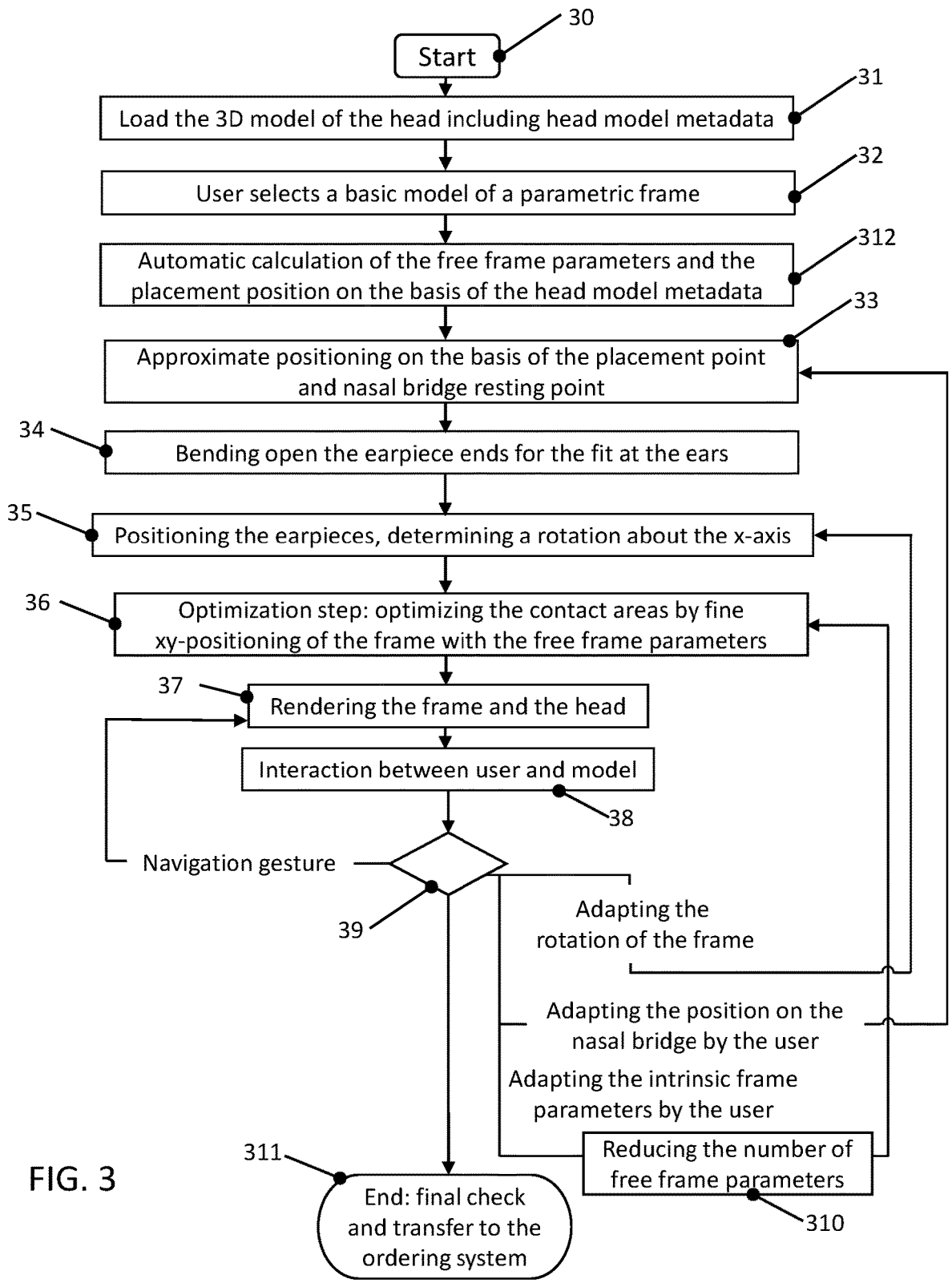
FIG. 3 shows a flowchart that provides an overview of a method for fitting a pair of spectacles according to one exemplary embodiment.

FIG. 3 shows a flowchart of an overall method for virtual fitting of a pair of spectacles according to one exemplary embodiment. The present disclosure relates, in particular, to partial steps of this method.

The method begins in step 30. In step 31, a 3D model of the head, including head model metadata, is loaded from a memory. The 3D model can be created with the aid of image recordings, as explained above with reference to FIGS. 1 and 2, or it may be an already available 3D model, for example from an earlier fitting of a pair of spectacles to a certain person.

The head model metadata are data that contain information items about features of the 3D model but not the model itself. In particular, the metadata may supply additional information in respect of the 3D model of the head and/or contain certain points, curves or regions on the 3D model of the head. More details about the use of such metadata are also found in the European patent application EP 3410178.

A basic model of a spectacle frame described by a parametric frame model is selected in step 32. The parametric frame model has free parameters, i.e., parameters to be determined. Examples of such free parameters have already been specified further above in the context of the description of the parametric frame model, specifically the bridge width or earpiece length of the spectacle frame, or else a form of a frame rim of the spectacle frame.

In step 312, at least some of the parameters are then calculated on the basis of a fitting guideline associated with the frame model, as described above and explained in more detail below. Other parameters are determined on the basis of an anatomical fitting, as likewise already explained.

Then, there is virtual donning of the spectacles with more in-depth anatomical fitting in steps 33 to 310. To this end, in step 33 there is approximate positioning on the basis of a placement point and a nose bridge resting point, as already described in the European patent application EP 3410178. The spectacle earpieces are bent open to the ears of the head and the earpieces are positioned, wherein there may be a rotation about an x-axis of the pair of spectacles, in steps 34 and 35. Here, the x-axis corresponds to a direction that connects the eyes in the head, the z-direction corresponds substantially to the direction of the earpieces and the y-direction is perpendicular thereto. Contact areas of the pair of spectacles are optimized in step 36 by means of fine positioning in the xy-plane. Moreover, parameters not yet set in step 312 can be adapted further here. Steps 34-36 in this case correspond to the corresponding steps described in the European patent application EP 3410178. Within the scope of this fitting, the parametric spectacle model can be deformed and positioned, in particular, after the parameters have been determined in step 312.

The frame and the head are then rendered in step 37, i.e., there is an appropriate representation on the display 16 of FIG. 1. This rendering, too, is already described in the European patent application EP 3410178. Here, rendering or image synthesis is understood to be the creation of an image (e.g., for display on a computer monitor) on the basis of raw data, from the respective models in this case.

Then, there is an interaction of the user with the model in step 38 which, as illustrated in step 39, may have various consequences. Thus, there may simply be navigation, for example in order to observe the head from a different direction. In this case, there is new rendering in step 37.

The interaction in step 39 also allows manual adaptation of the rotation of the frame about the x-axis. In this case, the method returns to step 35, for example to determine the earpieces in accordance with the new position of the frame.

Moreover, by virtue of the interaction of the user with the model, the position of the spectacle frame on the nose bridge of the head model can also be adapted by a user of the apparatus. This substantially changes the position of the spectacle frame set in step 33. Therefore, the method returns to step 33 in this case.

These previously described types of interaction, in particular navigation, for example for changing the observation angle, adapting the rotation and adapting the position of the pair of spectacles disposed on the nose bridge, have likewise already been explained in detail in the European patent application EP 3410178.

Moreover, one of the frame parameters of the parametric frame model can also be set by the user within the scope of the interaction. By way of example, the user can in this case modify the determination of parameters implemented by the automatic calculation in step 312. In this case, this reduces the number of free frame parameters in step 310 and the method is continued in step 36. If the user is finally satisfied with the fit following the interaction, the method is terminated in step 311. In the process, there can still be a final check. The user (e.g., an optician) checks the order data during the final check. In the process, the data of the order and corresponding pictorial representations are presented to the user on an overview monitor. The representations show the parameters of the spectacle frame and/or of the head determined within the scope of the method, such as the bridge width and the nose wing angle, etc., and also the parameters of the ordered frame, possibly also with notes about deviations from an ideal form which, e.g., is prescribed by the fitting guidelines. The determination of such parameters will also be explained later. Then, the ascertained parameters can be transmitted to an ordering system of the respective manufacturer in order to order a real spectacle frame with the corresponding parameters.

Individual aspects of the method of FIG. 3 will be explained in greater detail below with reference to FIGS. 4-15.

Figure 4:
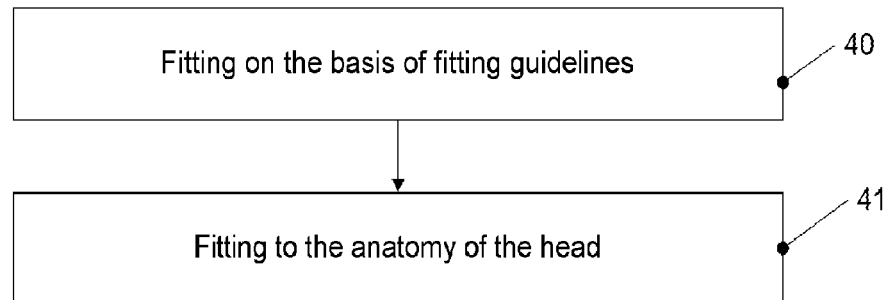
FIG. 4 shows a flowchart of a method according to one exemplary embodiment, which is usable in the method of FIG. 3.

FIG. 4 shows a flowchart of a method according to one exemplary embodiment. FIG. 4 shows a subdivision of the spectacle fitting into fitting on the basis of fitting guidelines associated with a respective parametric frame model, followed by fitting to an anatomy of the head.

In the method of FIG. 4, the parametric frame model is fitted to a 3D model of the head of the person on the basis of fitting guidelines in step 40, the fitting guidelines being predetermined by the spectacle frame manufacturer of the respective spectacle frame, specifically for the spectacle frame. These fitting guidelines may relate to esthetic prescriptions, as likewise explained in greater detail further below. Implementation examples for this step will be explained in even greater detail later. By way of example, step 40 can be carried out within the scope of step 312 of FIG. 3.

A first portion of parameters of the parametric frame model can be set by the fitting in step 40.

Then, general fitting to the anatomy of the head of the person is undertaken in step 41, i.e., the fitting in step 41 is implemented independently of the specific fitting guidelines. This fitting can be implemented as described in the prior art cited at the outset, and can likewise be implemented in step 312 or optionally also in the fitting in steps 34 and 35. Then, the anatomical spectacle fitting can also be implemented directly on the basis of the metadata of the head model, or else as explained in Johannes Eber, "Anatomische Brillenanpassung", Verlag Optische Fachveröffentlichung GmbH, 1987, page 23ff.

Figure 5:
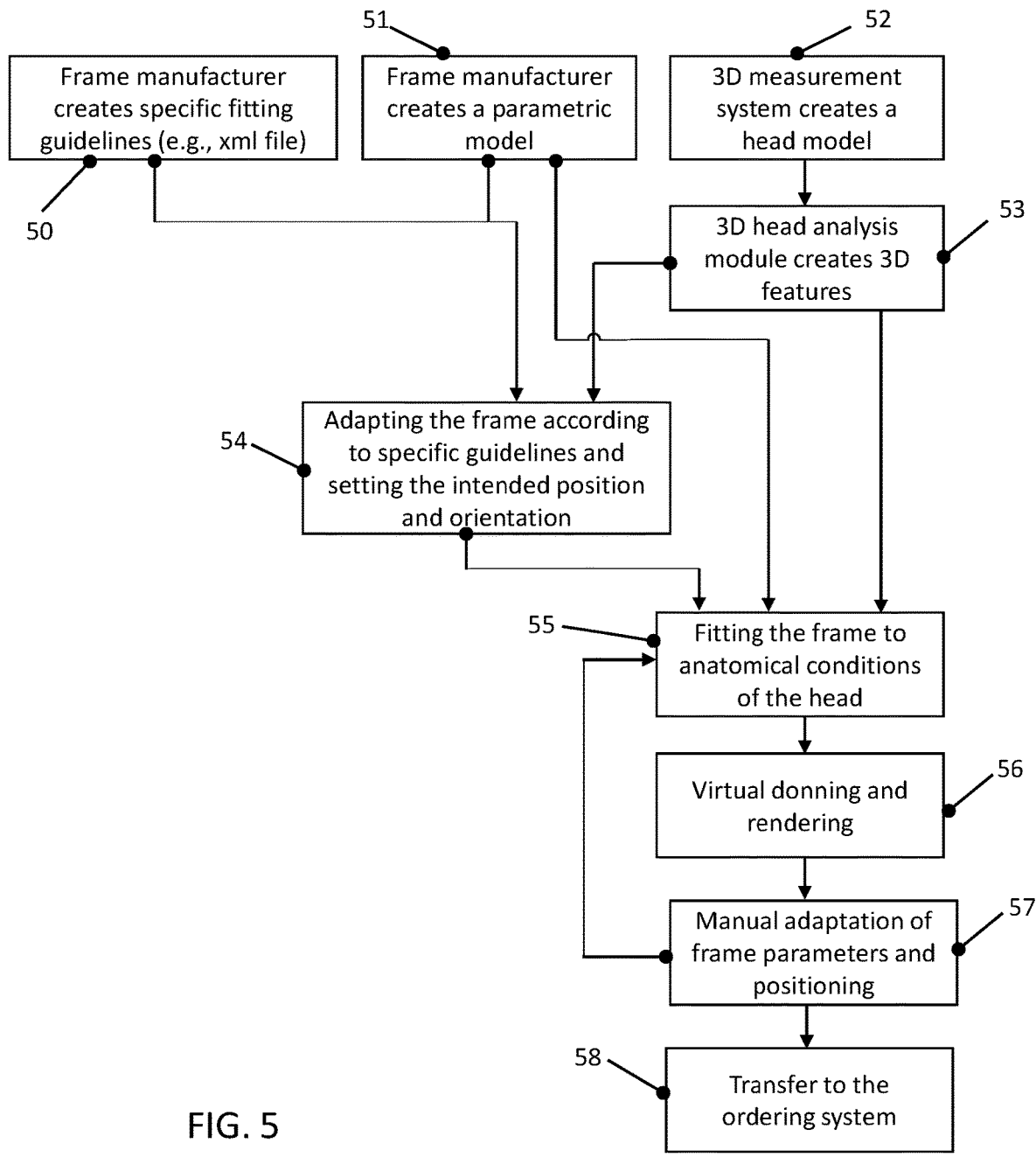
FIG. 5 shows a flowchart of a method according to one exemplary embodiment, which is usable within the scope of the method of FIG. 3.

FIG. 5 shows a detailed flowchart of an implementation of the method of FIG. 4.

The input data for the method are provided in steps 50-53 in FIG. 5. In step 51, a frame manufacturer creates a parametric frame model for a spectacle frame. The parametric frame model from step 51 can be converted into a uniform standardized format, which is used in the method according to the disclosure if the data are supplied by the spectacle manufacturer in a proprietary CAD (computer aided design) format.

Moreover, there can be a data reduction (e.g., a reduction in the number of triangles or voxels in the 3D model) or a data compression with the aid of conventional compression methods.

In step 50, the frame manufacturer creates specific fitting guidelines for this parametric frame model, which, as already explained, can take account of esthetic aspects when fitting the frame.

A 3D model of the head of the person is created and analyzed in steps 52 and 53. Here, the model is initially created in step 52 with a 3D measurement system, in particular with the camera device shown in FIG. 2. Other measurement systems, such as 3D head scanners, can also be used. Examples of such head scanners are found at cyberware.com/products/scanners/ps.html or www.3d-shape.com/produkte/face_d.php, in each case as of Jun. 8, 2017. In step 53, points or regions are then identified as features on this head model, for example points and features as are also used in the prior art explained at the outset.

Then, the frame is fitted in step 54 in accordance with the specific fitting guidelines, corresponding to step 40 in FIG. 4. Additionally, an intended position and orientation of the spectacle frame can be set as a start value for the fitting in step 54. A position by means of metadata like in the European patent application EP 3410178 with predetermined standard parameters for the parametric frame model can serve as intended position and intended orientation, which may serve as a start value for the fitting. As an alternative thereto, the intended position can be calculated from the specific fitting guidelines in some cases. By way of example, the specific fitting guidelines define the preferred position of the frame rim with respect to the pupil centers in the xz-plane; the intended vertex distance (e.g., 12 mm) defines the position in the direction of the y-axis. The forward inclination as part of the orientation of the frame in space, that is to say the angle about the x-axis, can also be set to an intended value of 9 degrees, for example. This may likewise be a part of the specific fitting guidelines.

Then, the frame is fitted to anatomical conditions of the head in step 55. Here, parameters that have not yet been fitted in step 54, i.e., which are still free parameters, are fitted further.

In step 56 there is virtual donning and rendering, and a manual fitting in step 57. Here, the virtual donning and manual fitting are implemented as already described with reference to reference signs 33 to 310 in FIG. 3.

In step 58, there is a transfer to an ordering system of the frame manufacturer, corresponding to step 311 in FIG. 3.

The use of frame-specific fitting guidelines and the corresponding fitting are now explained in more detail with reference to FIGS. 6-10.

Figure 6:
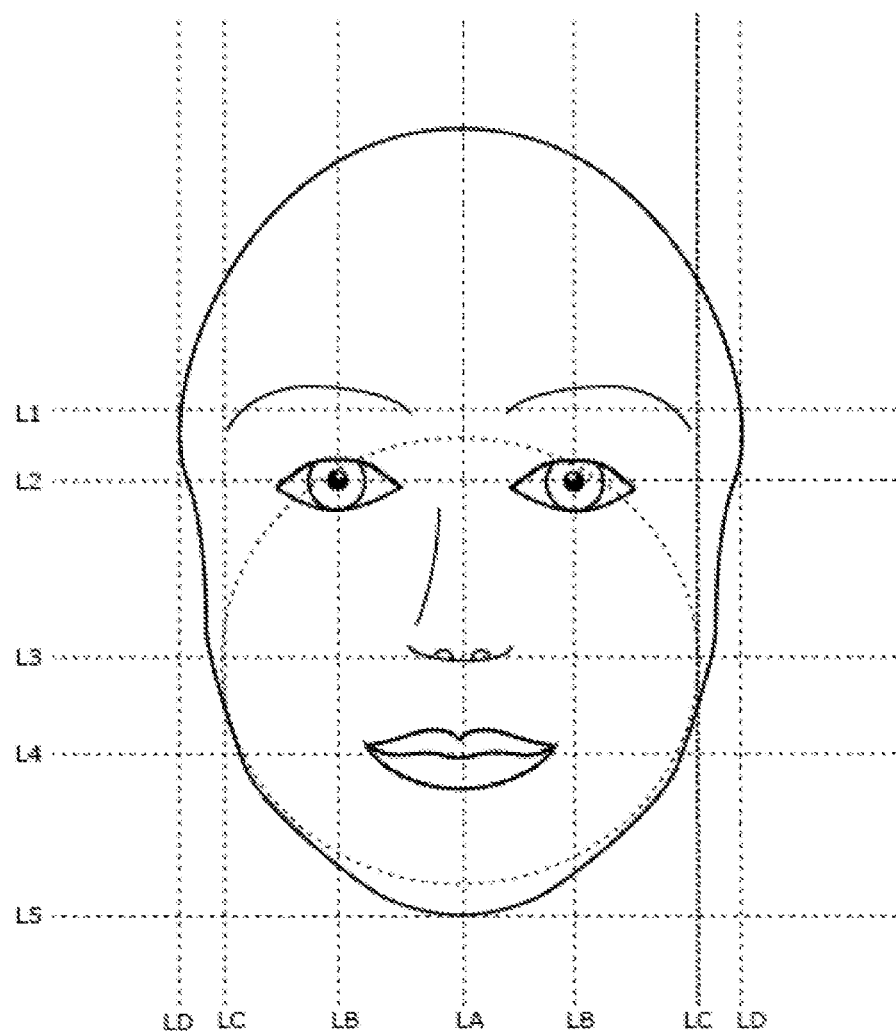
FIG. 6 shows a view for elucidating features of a head that may be referred to in fitting guidelines.

FIG. 6 shows various features of the face, which are suitable as features and points in the face for such specific fitting guidelines. Expressed differently, a target position or target range of features of the spectacle frame relative to such points of the face is provided in the fitting guidelines in such an exemplary embodiment. Such features of the face are also explained in Johannes Eber, "Anatomische Brillenanpassung", Verlag Optische Fachveröffentlichung GmbH, 1987, page 17ff.

Examples include:
- The positions of the eyes, in particular the pupil centers (points of intersection of the line L2 with the lines LB in FIG. 6). The line L2 moreover denotes the pupil axis.
- Box dimensions of the eyes, i.e., the dimensions of a rectangle placed around the eyes—position of each rectangle, width and height of the rectangles.
- Position of the nose in accordance with lines LA and L3 in FIG. 6.
- The width of the face and the position of the temples corresponding to the lines LD in FIG. 6.
- The height of the face between the lines L1 and L5 in FIG. 6, and the line of the chin (L5) in FIG. 6.
- The radius of curvature of the chin region, i.e., of the part of the chin touching the line L5.
- The position of the eyebrows, wherein the line L1 in FIG. 6 represents the central axis of the eyebrows and the lines LC represent an outer limit of the eyebrows.
- The position of the mouth in accordance with line L4 in FIG. 6

The aforementioned features can be identified by a procedure as described later by means of a parametric head model or else by image analysis methods (image recognition) and/or by machine learning in images recorded by the camera device of FIG. 2, and the position of the features can thus be determined on the 3D model of the head. One possibility for automatic recognition of such features is also described in V. Kazemi, J. Sullivan, "One millisecond face alignment with an ensemble of regression trees." Proceedings of the IEEE Conference on Computer Vision and Pattern Recognition, 2014.

In the following description, designations such as left eye, right eye, left half of the face or right half of the face should be understood from the point of view of the person for whom the pair of spectacles is fitted.

Figure 7:
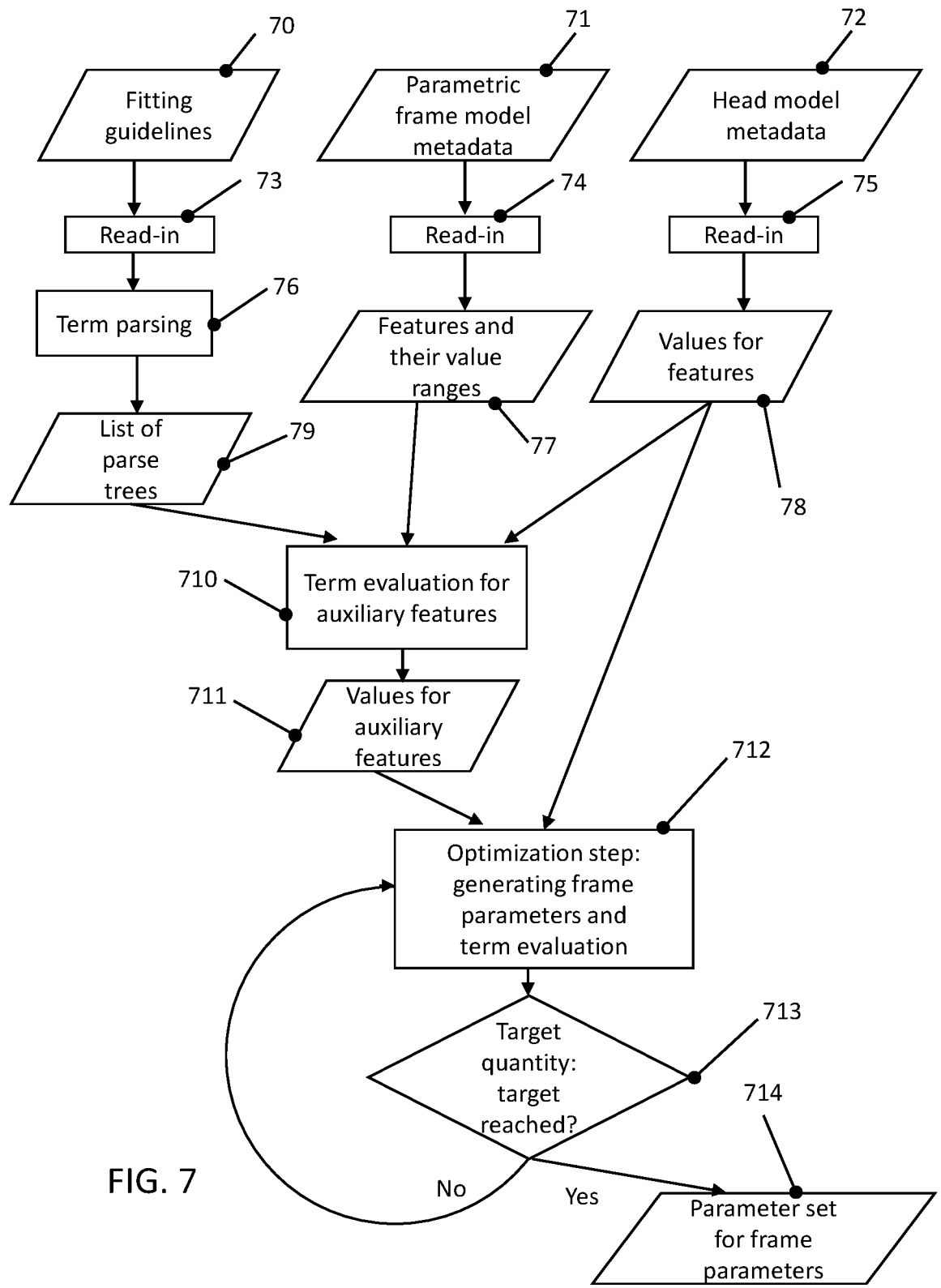
FIG. 7 shows a detailed implementation of method step 40 in FIG. 4 or of step 54 in FIG. 5.

FIG. 7 shows a detailed method for fitting the spectacle frame on the basis of the fitting guidelines, i.e., a detailed example for step 40 in FIG. 4 or step 54 in FIG. 5, together with the provision of the data.

Fitting guidelines for a parametric frame model are provided at step 70 in FIG. 7, the fitting guidelines being read into a computing device in step 73 in order to be able to use these in the presented method. Here, the fitting guidelines are stored as a text file, for example, such as an xml file or JSON file.

A parametric frame model is provided in step 71, the fitting guidelines at step 70 being assigned thereto. Metadata that denote certain regions or points of the frame model, for example, may be assigned to the parametric frame model. Such metadata of a frame model are also described in the European patent application EP 3410178. This parametric frame model is read in in step 74. In step 77, the parameters of the parametric frame model arising from being read in at step 74 and their value ranges are provided for subsequent optimization. Finally, a 3D model of the head of the person for whom a spectacle frame is to be fitted is provided with associated metadata at step 72, the model being read in in step 75.

The fitting guidelines are parsed in step 76. Parsing is understood to mean a decomposition and conversion of input data into a format more suitable for further processing. A parser is a corresponding device (usually implemented by a computer program), which carries out such parsing. More details in this respect are found in the German Wikipedia article "Parser," as of May 19, 2017.

Here, the fitting guidelines are translated, in particular, into a format that is suitable for the subsequent optimization process. Here, as explained, the fitting guidelines may contain target quantities and/or admissible ranges, in particular for distances between features of the spectacle frame and features on the head, for example a distance between the upper frame rim and the eyebrows, a distance between the upper frame rim of the frame and an upper edge of the eyes, a distance of the lower frame rim to a lower edge of the eyes or a relative position of the pupil with respect to the frame rims. Moreover, it is also possible to use distances to calculated derived features, i.e., points or regions that are derived from a plurality of features of the head and/or of the frame. Such derived features are also referred to as auxiliary features.

Figure 8:
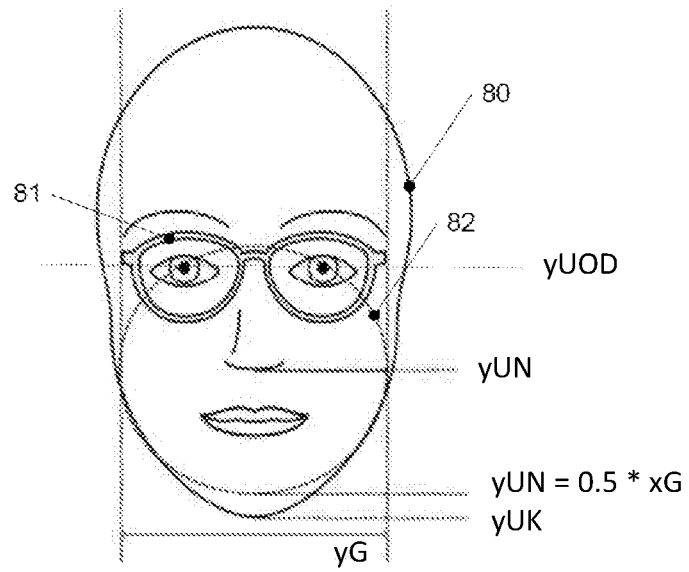
FIG. 8 shows a diagram for explaining auxiliary features.

One example of such an auxiliary feature is illustrated in FIG. 8. FIG. 8 shows a head 80 with a spectacle frame 81. An imaginary circle with a radius of half the width of a face and a center at the lower edge of the nose is denoted by 80. In FIG. 8, yUN denotes the lower edge of the nose, yUK denotes a lower edge of the chin and yUOD denotes a lower edge of the eyes. The width of the face, i.e., the distance between the lines D in FIG. 6, is denoted by yG. An example of a derived auxiliary feature yH which is defined with the aid of a term in the fitting guidelines 70 detected during parsing in step 76 is:

$$yH=(yUK-(yUN-0.5 \cdot xG))/0.5 \cdot xG.$$

This value yH represents a deviation of a calculated chin lower edge of an ideal face from a real chin lower edge as a ratio to half the width of a face and the value is a measure for the vertical length of the face below the nose. Such an auxiliary feature can be used to set the proportions of the lower frame rims of the spectacle frame. As a result of this, it is possible to take account of the fact that the length of the face in the vertical direction may also have an influence on the esthetic impression caused by the spectacle frame and hence that the specific fitting guidelines may predetermine a relationship of the size and/or form of the spectacle frame with respect to the parameter yH.

A further example of a fitting guideline is a position of the pupil within a frame-circumscribing box. This is illustrated in FIG. 10D. FIG. 10D shows the spectacle frame 81 with a frame-circumscribing box 102, for the right eye in this case.

The fitting point height of the pupil (height of the pupil above the lower frame rim) is denoted by y; the horizontal position of the pupil is denoted by x. The width of the box 102 is $\Delta a$ and the height of the box is $\Delta b$. By way of example, the fitting guideline may then provide that, in the horizontal direction, the pupil should be situated between the box center and the nasal golden section, i.e., $\Delta a \cdot 3.82 < x < \Delta a \cdot 0.5$. Here, the golden section means that the ratio of x to $\Delta a$-x equals the ratio of $\Delta a$-x to $\Delta a$, as is the case for $x = \Delta a - 3.82$. Eye positions closer to the inner side of the frame rim than this golden section are generally found to be less esthetic.

A similar guideline can set the eye position in the vertical direction, specifically that the pupil is precisely situated, in the vertical direction, between the box center of the box 102 and the value for the golden section above the center, i.e., $\Delta b \cdot 0.5 < y < \Delta b \cdot 0.618$.

The fitting guidelines can also be provided directly as a calculation formula, wherein the variables of the calculation formula then are the above-described features. Expressed differently, the frame parameters in the specific fitting guideline can be specified directly as a term, or they can be determined iteratively by way of an optimization loop. In the latter case, a fitting quality defined with the aid of the terms is optimized; the terms set targets—however, these targets are generally not hit; therefore, e.g., an expression in the form "target quantity=term" would only contribute to the fitting quality within the meaning of an optimization, e.g., within the meaning of the method of least squares, but would not directly satisfy this.

Parsing in step 76 is implemented, in particular, for the mentioned auxiliary features, for target quantities and calculation prescriptions to this end and, optionally, for a quality value as a scalar quantity, which is available, for example, in the form of a weighted squared sum of the deviation from the target quantities and which may optionally have an additional penalty term, as has already been described above.

Then, a list of syntax trees for the terms of step 76 is created in step 79.

Accordingly, the position, orientation and dimensions for values such as the position of the pupil center, the position and dimensions of the eye (e.g., a rectangle circumscribing the eye), the position, orientation and dimensions of the nose, the position, orientation and position of the eyebrows and/or the position of the chin are determined in step 78 for the head model.

The terms of the tree are evaluated for auxiliary features in step 710, i.e., the auxiliary features present are determined, and values for these auxiliary features, for example for the value yH explained above, are determined in step 711. Then, there is an optimization step in step 712. Here, frame parameters of the parametric frame model are varied and the terms are evaluated until target quantities are reached in step 713. From this, a parameter set for a portion of frame parameters that were fitted on the basis of the fitting guidelines emerges at 714. In particular, these are parameters with an esthetic effect, for example scaling of the spectacle frame, "as-worn" pantoscopic angle of the spectacle frame and/or a form of the frame rim in the case of a variable frame rim. Further parameters, such as, e.g., angles of nose pads or a length of spectacle earpieces or a bridge width, are initially left at standard values that are predetermined by the manufacturer. These are then adapted during the anatomical fitting (e.g., step 41 in FIG. 4).

The optimization loop may also comprise virtual donning, e.g., as described in the European patent application EP 3410178. The preceding steps including the fitting of the parameters of the parametric frame model ensure a convergence of the optimization to an optimal fitting of a pair of spectacles.

Emerging as a result during the virtual donning there are, firstly, the parameters of geometric motion (6 degrees of freedom, see the German Wikipedia article "Bewegung (Mathematik)" ["Motion (Mathematics)"] as of May 22, 2017), presentable, for example, as a rotation matrix and translation vector, and, secondly, the parameters of the bending of the frame. As a rule, the latter is a single parameter for the angle traversed at the ear resting point during bending. This corresponds to virtual donning, as described in the European patent application EP 3410178. The result of the virtual donning described there are the rotation and translation of the frame and the parameters of the deformation of the earpieces.

After donning, all frame-specific features are available in the coordinate system of the head. To this end, geometric motion is applied to the features. By way of example, the position and orientation of the right and left nose pad of the individualized frame—i.e., of the frame corresponding to the parametric frame model with fitted parameters—are calculated. In the ideal case, this position and orientation should correspond with the previously calculated position in the step of fitting the frame-specific parameters since the corresponding feature of the nose wing was brought into correspondence with the feature on the frame within the scope thereof, as will also be explained specifically later. However, on account of restrictions to the individualization in the nose region, it may be the case that the process of virtual donning does not yield the same result as the fitting procedure when determining the position of the frame. By way of example, this may be due to asymmetries of the real nose in conjunction with a symmetric nose rest of the frame. However, as a rule, there should only be very minor differences between the positions. In the case of minor differences (e.g., a distance of the nose pad centers of less than 1 mm), this can be ignored. In the case of relatively large differences, the new position following the virtual donning may trigger a new fitting procedure for the parameters to be determined on the basis of the frame-specific fitting guidelines. Feedback in the form of a notification to the operator in respect of a possible incompatibility of the frame model is also possible.

Figures 10A, 10B, 10C:
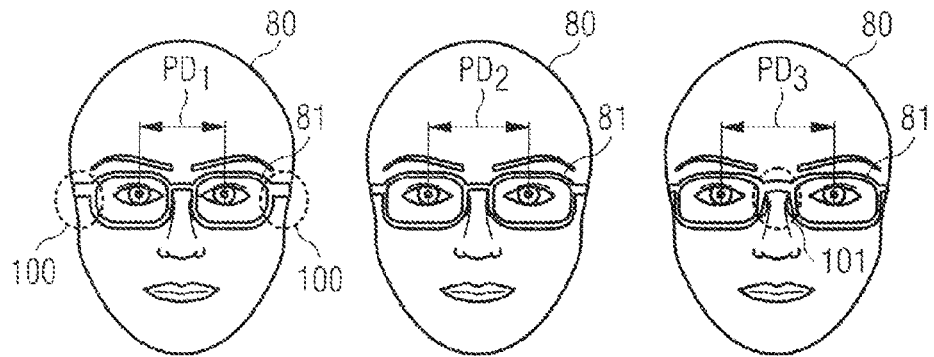
FIG. 10A shows a schematic view of a head for elucidating a fitting on the basis of fitting guidelines for a relatively small interpupillary distance.
FIG. 10B shows a schematic view of a head for elucidating a fitting on the basis of fitting guidelines for a mid interpupillary distance.
FIG. 10C shows a schematic view of a head for elucidating a fitting for a relatively large distance.
Figure 10D:
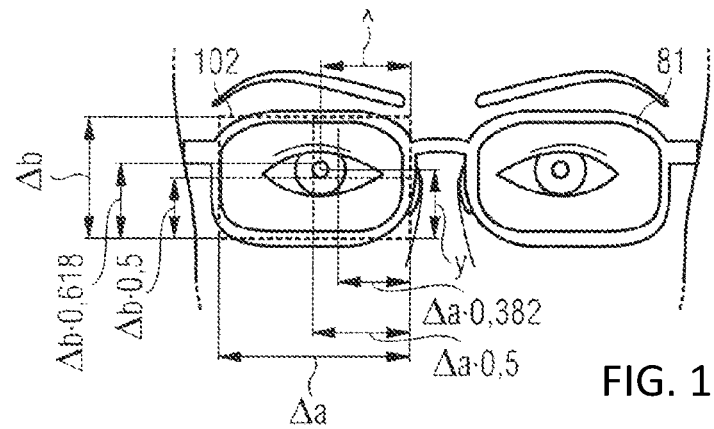
FIG. 10D shows a spectacle frame with a frame-circumscribing box.

FIGS. 10A to 10C elucidate this positioning of the eye within the box 102 for different interpupillary distances $PD_1$ (FIG. 10A), $PD_2$ (FIG. 10B) and $PD_3$ (FIG. 10C) in the head 80, wherein $PD_1$ is a relatively small interpupillary distance, $PD_2$ is a mid interpupillary distance and $PD_3$ is a relatively large interpupillary distance. For esthetic fitting, an outer rim of the frame form 100 is thickened in the case of FIG. 10A and provided with dominant endpieces, for example in order to maintain the condition of the golden section. The endpieces are the outer part of the central part of the spectacle frame; the inner part is referred to as bridge. Thus, the modified parameter in this case is the frame form. In the case of FIG. 10C, a dominant region or dominant bridge is chosen, possibly in conjunction with a greater bridge width, in order to obtain a desired esthetic impression.

Figure 9:
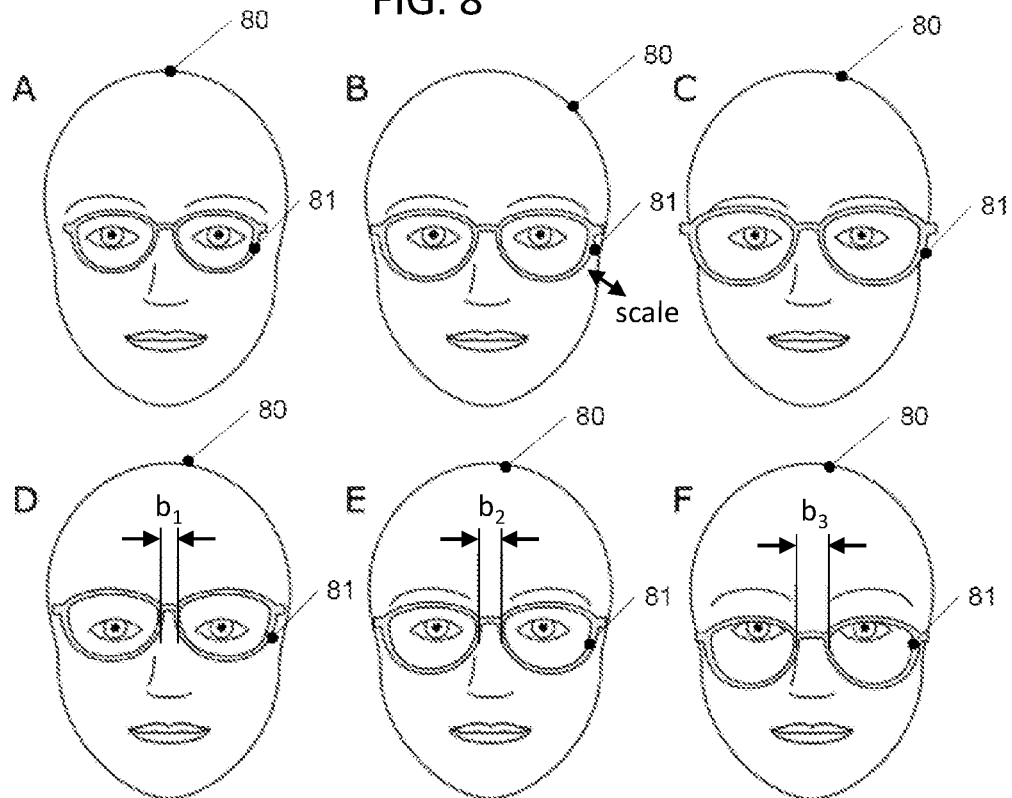
FIG. 9 shows schematic views of a head for elucidating a fitting.

FIG. 9 shows examples of fitting the parameters on the basis of fitting guidelines for obtaining a desired esthetic effect. Here, FIGS. 9A to 9C show an effect of the scaling of the spectacle frame 81. In FIG. 9A, a very small frame is virtually placed on the person; it is too small according to esthetic and fashion aspects. The frame is too large in FIG. 9C. In FIG. 9B, the frame has a medium size. In order to ensure an esthetically appropriate size for the pair of spectacles, the fitting guidelines may prescribe distances between the frame rim and the edge of the face and/or the eyebrows in this case.

FIGS. 9D to 9F show the influence of the bridge width. In the exemplary embodiment described here, the bridge width is set during anatomical fitting in order to ensure an anatomically correct fit of the spectacle frame on the nose, which will be explained in more detail further below. However, it may also alter the esthetic impression, which can be additionally taken into account during the anatomical fitting. A small bridge width $b_1$ is chosen in FIG. 9D. Here, the frame sits very high due to a collision with the nose bridge. The bridge width was slightly widened to a bridge width $b_2$ in FIG. 9E. As a result, the spectacle frame is seated slightly lower and more harmoniously. In the case of FIG. 9F, the bridge width was lowered even further to a value $b_3$. Here, care can be taken within the scope of anatomical fitting that the pupils are situated within a predetermined range relative to the frame rims, for example on the basis of the golden section.

Consequently, what can be ensured with the aid of fitting guidelines and the division into fitting on the basis of fitting guidelines followed by fitting to the anatomy of the head is that prescriptions of a spectacle manufacturer, which are of an esthetic nature in particular, can be satisfied.

In the aforementioned methods, and also in other methods for fitting a pair of spectacles, for example in the method described in the European patent application EP 3410178 or in some of the methods explained at the outset as prior art, the position of certain points on the 3D model of the head is required and/or metadata are required, which metadata characterize certain regions for fitting the spectacles, such as a resting point or an ear resting region. One option lies in determining such points or regions manually or by means of pattern recognition methods. A further option will now be described with reference to FIGS. 11-15.

Figure 11:
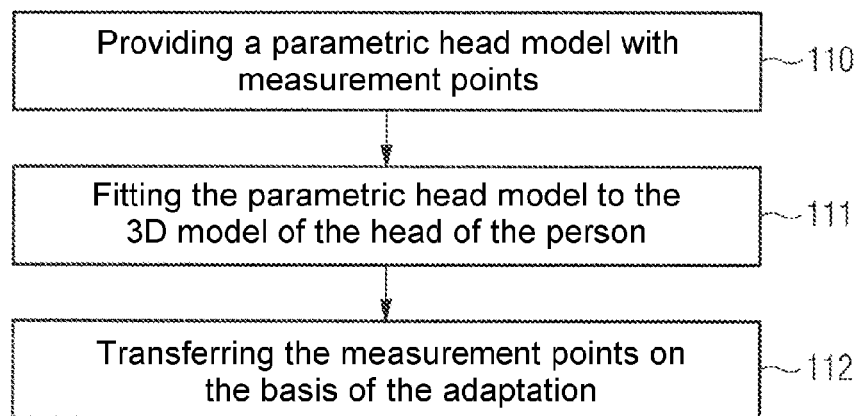
FIG. 11 shows a flowchart of a method according to one exemplary embodiment, which is usable within the scope of the method of FIG. 3.

FIG. 11 shows a method for setting measurement points to the 3D model of the head of the person according to one exemplary embodiment. Here, measurement points should be understood to mean points which can be used for the above-described methods, such as, e.g., points describing facial features such as ears, eyes, eyebrows and the like.

In step 110, a parametric head model with measurement points is provided. Here, a parametric head model is a parametric model that describes a head. Changing the parameters of the parametric model changes the head form described by the head model. The term parametric head model, as used here, also includes models that only describe part of the head, for example only the parts required for fitting spectacles (in particular, the region of the eyes, nose and ears). An example of a parametric head model will be explained later with reference to FIGS. 13A and 13C. Measurement points are set on this parametric head model, for example by manual selection. Examples of such measurement points will likewise be explained later with reference to FIGS. 13A and 13C.

Then, in step 111, the parametric head model is fitted to the 3D model of the head of the person. To this end, use can be made of any conventional optimization methods that fit the parameters of the parametric head model in such a way that there is the smallest possible deviation between the parametric head model and the 3D model of the head of the person (e.g., by means of the least-squares method or the methods in the article by J. Booth et al., cited above). Then, in step 112, the measurement points are transferred to the 3D model of the head of the person on the basis of the fitting. Expressed differently, the position of the measurement points on the fitted parametric head model is used to set corresponding measurement points on the 3D model of the head. This can be implemented by projection of the parametric head model onto the 3D model of the head, for example by using a point of intersection of a normal vector, i.e., of a vector that is perpendicular at the measurement point on the parametric head model, with the 3D model of the head. In accurate models, it is also possible to use the position of the measurement point on the parametric head model directly as a position on the 3D model of the head.

In this way, it is possible to determine measurement points for substantially any 3D model of any head, with the measurement points only having to be set once on the parametric head model.

Figure 12:
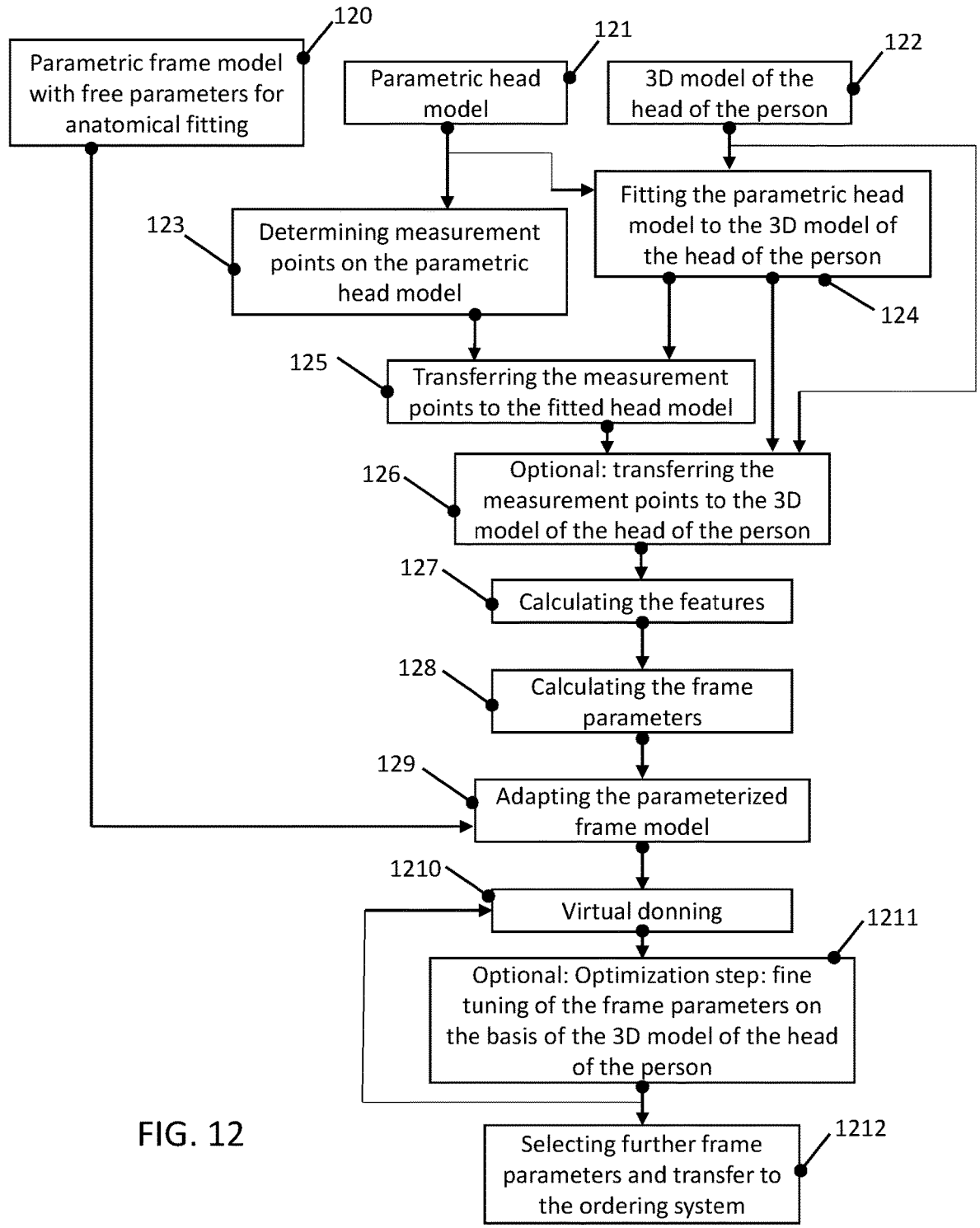
FIG. 12 shows a flowchart of a detailed implementation of the method of FIG. 11.

FIG. 12 shows a more detailed method, which uses a parametric head model for setting measurement points on a 3D model of the head of a person, embedded in a method for virtual fitting of a pair of spectacles. Instead of the method for virtual fitting of the pair of spectacles in FIG. 12, the methods explained above with reference to FIGS. 1-10 may also serve as a possible application for the method of FIG. 11.

In FIG. 12, a parametric frame model with free parameters is provided in step 120. In the exemplary embodiment in FIG. 12, the free parameters serve for anatomical fitting. In other exemplary embodiments, there can be an additional fitting by means of frame-specific fitting guidelines, as explained above.

In step 121, a parametric head model is provided. The parametric head model can be a face model or head model determined on the basis of principal component analysis (PCA), as described in, e.g., A. Brunton, A. Salazar, T. Bolkart, S. Wuhrer, "Review of Statistical Shape Spaces for 3D Data with Comparative Analysis for Human Faces," Computer Vision and Image Understanding, 128:1-17, 2014, or else a head model as described in J. Booth, A. Roussos, S. Zafeiriou, A. Ponniah and D. Dunaway, "A 3D Morphable Model learnt from 10,000 faces," 2016 IEEE Conference on Computer Vision and Patent Recognition (CVPR), Las Vegas, Nev. 2016, pages 5543-5552, doi:10.1109/CVPR.2016.598. In step 122, a 3D model of the head of the person is provided, which model can be created by the camera device of FIG. 2, for example.

In step 123, measurement points are determined on the parametric head model. An example of such a 3D model of at least a part of the face is presented together with coordinate axes in FIG. 14.

In step 123, measurement points are determined on the parametric head model. To this end, a so-called standard head of the parametric head model is provided. A standard head is a head in which the parameters of the parametric head model assume predetermined standard values. In the case of a head model on the basis of principal component analysis, this may be an average head, for example, which corresponds to a first component of the principal component analysis.

Figure 13A:
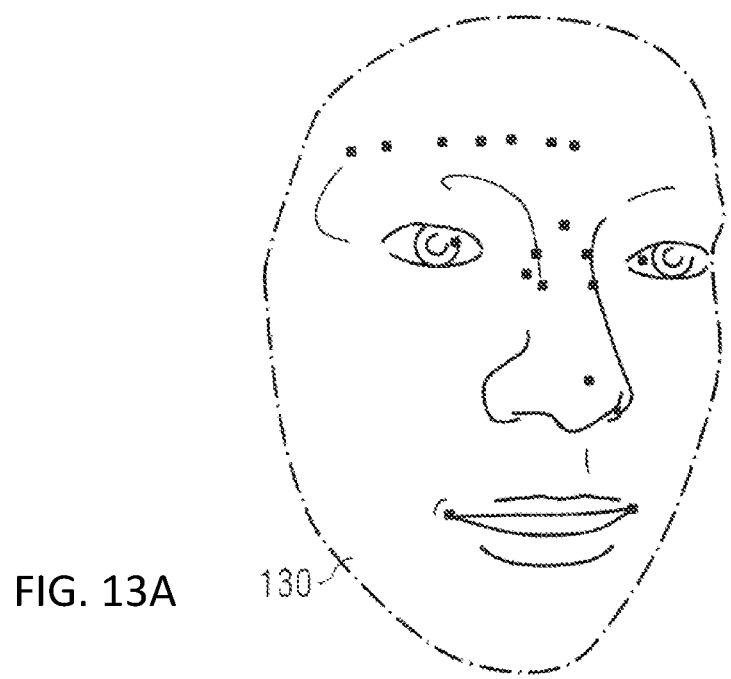
FIG. 13A shows an illustration for elucidating a head model.
Figure 13B:
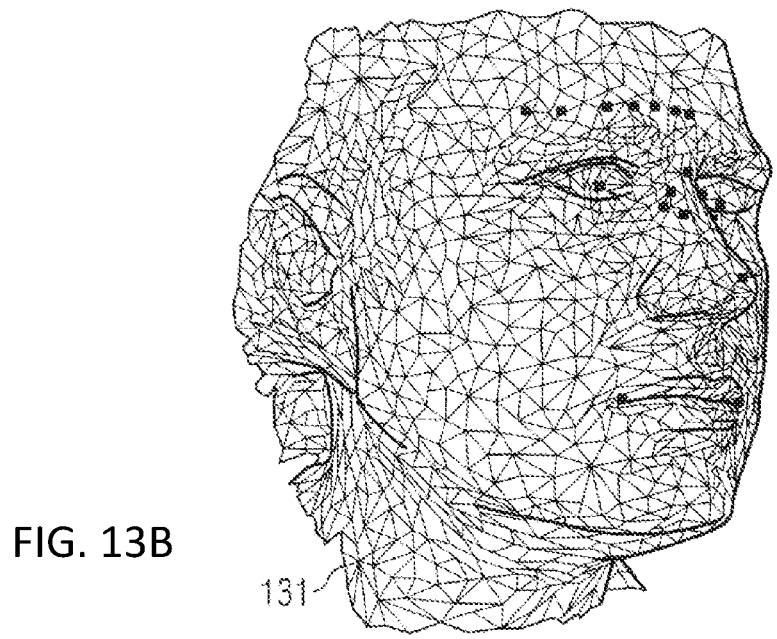
FIG. 13B shows an illustration for elucidating a head model.
Figure 13C:
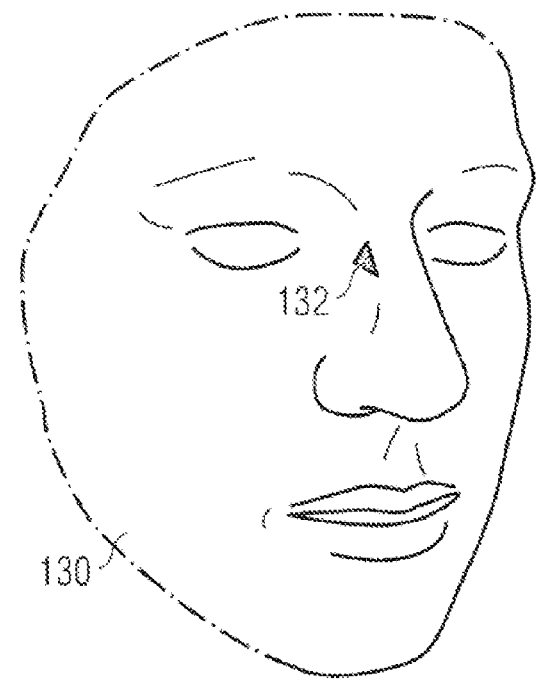
FIG. 13C shows an illustration for elucidating a head model.

In step 123, measurement points are set on the parametric head model. This can be implemented manually by setting points. An example for such a stipulation is shown in FIG. 13A. Here, a multiplicity of points have been set on a standard head 130 of the parametric head model, for example corner of the mouth, tip of the nose, points along a forehead wrinkle, eye points, nose bridge and points on the nose wings. A further example is shown in FIG. 13C. Here, a triangle 132, i.e., three points, is marked on a nose wing of the head model 130.

Then, in step 124, the parametric head model is fitted to the 3D model of the head of the person using a fitting process. A fitting process is a process in which parameters of the parametric head model are determined in such a way that the parametric head model is fitted as accurately as possible to the 3D model of the head of the person, for example according to the least squares criterion. The steps 123 and 124 can be carried out in any sequence. Step 123 need only be carried out once before the method is carried out, and so the determined measurement points can be used every time the method is carried out for different 3D models of heads of different persons and for different parametric frame models.

Figure 13D:
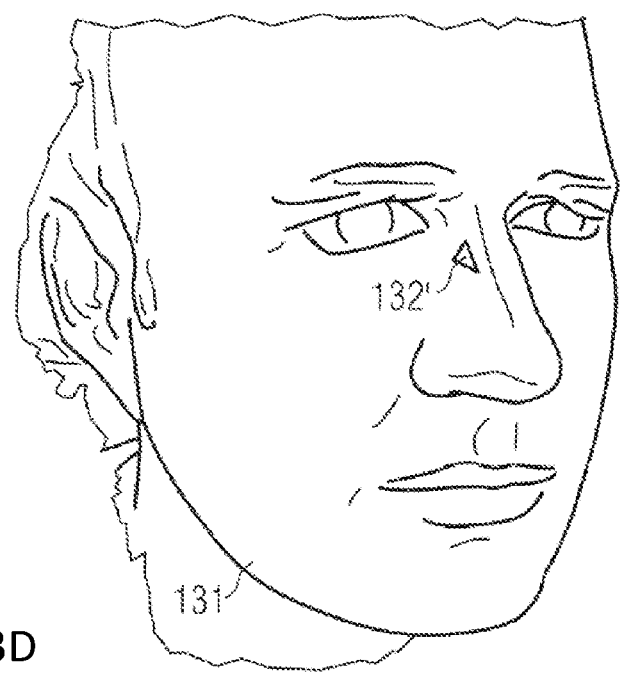
FIG. 13D shows an illustration for elucidating a head model.

Then, in step 125, the measurement points are transferred to the fitted parametric head model. Expressed differently, the position of the measurement points is determined on the fitted head model. To this end, substantially the same transformation used to arrive at the fitted parametric head model from the standard head model, on which the measurement points were determined in step 123, is applied to the measurement points, for example as described in the aforementioned article by J. Booth et al. Optionally, in step 126, the measurement points are transferred to the 3D model of the head. Whether step 126 is used depends on the accuracy of the employed model, i.e., on how accurately the fitted parametric head model corresponds to the 3D model of the head of the person. By way of example, step 126 can be omitted if the mean square deviation lies below a threshold value. The transfer of the measurement points from the fitted parametric head model to the 3D model of the head of the person can be implemented by a projection, in which a normal vector is determined through the respective measurement point on the fitted head model and the point of intersection of this normal vector with the 3D model of the head of the person is then used as corresponding measurement point on the 3D model of the head of the person. Examples are shown in FIGS. 13B and 13D. In FIG. 13B, the points of FIG. 13A are projected onto a 3D model 131 of the head of the person and, in FIG. 13D, the triangle 132 of FIG. 13C is projected onto the 3D model 131 as triangle 132'.

Figure 14:
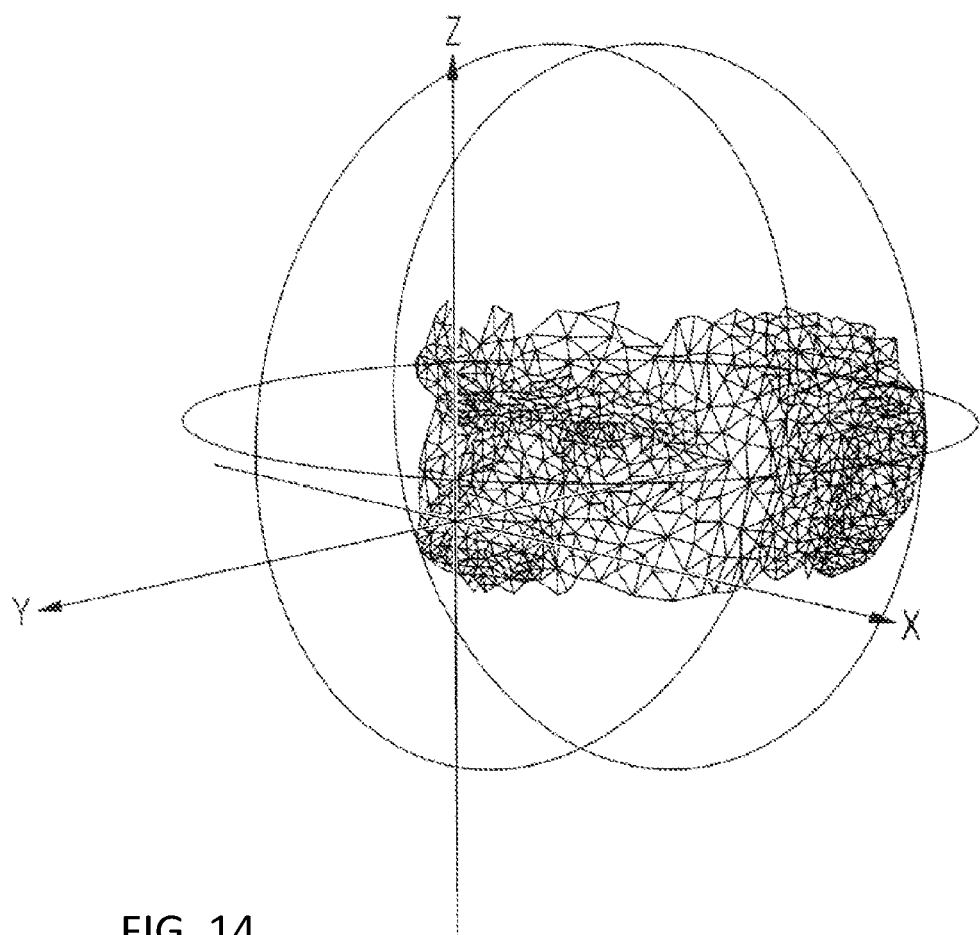
FIG. 14 shows an illustration for elucidating a head model.

This projection operates reliably in the case of many facial models since parametric models often have great smoothness, in particular a greater smoothness than a typical 3D model of the head as illustrated in FIG. 14. Here, the smoothness of surfaces can be defined as a measure of the local deviation of normal vectors. Alternatively, the local deviation of the point cloud of the 3D model of the head from an approximated polynomial surface may also be defined as a measure, for example in local regions with a diameter of 5 mm in each case. Polynomial surfaces are differentiable infinitely many times and consequently referred to as "smooth" in differential geometry. Local smoothing by means of "moving least squares" (MLS), which may be applied in exemplary embodiments, is described at pointclouds.org/documentation/tutorials/resampling.php, as of Jun. 8, 2017.

Moreover, a manual step can be used (not illustrated in FIG. 12) to mark further measurement points on the 3D model of the head. In particular, these may be points that are not readily detected by the 3D model, for example parts of the person concealed by hair. In particular, this may be the case for ears. Therefore, these points are then not accurately identifiable in the 3D model of the head of the person and the points can be added manually. An example of such a measurement point is a resting point of the spectacle earpiece on the base of the ear.

Then, in step 127, features are calculated on the basis of the measurement points (the measurement points at the fitted head model if step 126 is dispensed with or the transferred measurement points when step 126 is carried out). These features, also referred to as measurement features, are based on groups of measurement points and define a region of the head, for example.

The features can be ascertained by means of the direct calculation (e.g., 3 non-collinear points in space uniquely define a plane, the normal vector of which can be calculated by means of the cross product of the normalized difference vectors; 4 non-coplanar points define a sphere, 5 non-coplanar points define a cylinder) or by means of an approximation of a geometric primitive (points, lines or areas) such as a plane or sphere or cylinder to certain measurement points. Then, the feature is determined by the parameters of the fitted geometric primitives, for example by normal vector and reference point of a plane in the case of a plane or by a center and radius of a sphere in the case of a sphere, etc. Examples of such features, which are calculated in step 127, are specified below:

Left or Right Nose Wing

For the left or right nose wing of the nose, a plane (e.g., corresponding to the triangle 132' in FIG. 13D), which is defined by the approximation to a small region of the model in the region of the nose support or the region for the nose pads (e.g., with a diameter of 6 mm), can be used as a feature. The horizontal and vertical nose wing angle emerge from the position and orientation of the plane. Here, the plane is intersected by the coordinate axes in the center point of the region of the nose support and the arising angle is measured in each case. By way of example, if three points, corresponding to the triangle 132, are marked in each nose wing in FIG. 13C, the plane can be calculated from the three points. In the case of more than three points, the plane can be calculated by a fitting process, for example by way of principal component decomposition on the set of points, or by way of a fitting with the aid of the least-squares method. As mentioned above, a single plane is representable by a point (x, y and z) in the plane and a normal vector (nx, ny, nz) through this point, with x, y and z being Cartesian coordinates. Therefore, both nose wings together can be represented as a 12-tuple, i.e., by 12 values (2 points and 2 normal vectors), for example as $$(x_{[N,OD]}, y_{[N,OD]}, z_{[N,OD]}, nx_{[N,OD]}, ny_{[N,OD]}, nz_{[N,OD]},$$
$$x_{[N,OS]}, y_{[N,OS]}, z_{[P,OS]}, nx_{[N,OS]}, ny_{[N,OS]}, nz_{[N,OS]})$$

Here, the index N denotes the nose, the index OD denotes the right eye (oculus dexter) and the index OS denotes the left eye (oculus sinister).

Curvature of the Forehead

Here, a section of a circular curve in space can be fitted to measurement points on the forehead, as illustrated in FIGS. 13A and 13C. Parameters of this fit are the center, radius and normal vector of a plane in which the circle lies. This fitting can be carried out in two steps. Initially, a plane is fitted, as described above for the nose wings, and then a circle is also fitted within this plane. This fitting of the circle can be implemented for example by means of the least-squares method or any other conventional fitting method.

Eyebrows and/or Cheekbones

Here, a spline surface S (see the German Wikipedia article "Spline", as of May 23, 2017) or a bivariate polynomial (see, e.g., en.wikipedia.org/wiki/Polynomial#Definition→"bivariate polynomial," as of Jun. 8, 2017) is fitted in a region around the eyebrows and/or in a region about the cheekbones to the measurement points in the region of the eyebrows and in the region of the cheekbones. In a spline representation $$S_{(c1, \ldots, cn)}:(x,z) \rightarrow y$$

coefficients (c1, . . . , cn) of the spline function S are determined in such a way here that for a set of measurement points $\{(x1,y1,z1), \ldots, (xm,ym,zm)\}$ in the corresponding region (eyebrows or cheekbones), a root mean square error F is minimal, i.e., the error F has the following form:

$$F(c1, \ldots, cn) = \Sigma_{i=1 \ldots m}(yi - S_{(c1, \ldots, cn)}(xi,zi))^2.$$

In this representation, the assumption is made that later the process of donning the frame is implemented by a movement parallel to an xy-plane with, in each case, a fixed y-value in the coordinate system of FIG. 14. If a minimum distance between a back frame rim and the 3D model of the head is intended to be realized by the fitting process, this distance value can be provided in advance as an offset in relation to the spline surface. Then, contact can be detected as a result of correspondence in the y-values (since the y-value is stored in advance as an offset). To this end, each vertex of the back frame rim can be examined during the later fitting of the spectacle frame, and a respective vertex, given by the coordinates (x, y, z), is examined in respect of the difference $\Delta y = y - S_{(c1, \ldots, cn)}: (x, z)$. Upon detection of contact or immersion of the vertex in the model, then a position of the spectacle frame can be adapted or the frame rim of the spectacle frame can be modified.

Point at the Base of the Ear that Serves as a Resting Point for the Spectacle Earpiece To this end, a single point on the head model can be used; i.e., no measurement points need to be combined in this case. In other embodiments, an ear resting curve can be determined as described in the European patent application EP 3410178. Should use be made of a model without modeling of the ears (see above), for example a pure facial model, or should the ears have been covered when creating the 3D model of the head of the person, this point at the base of the ears can be generated differently, for example by way of machine learning from images that were used for the creation of the 3D model of the head, wherein a trained feature detector can be used to this end for the purposes of detecting the point at the base of the ear in the images. These points detected in the 2D image are projected onto the 3D model of the head in a further step. Information in respect of such projections is found in background literature in respect of projective geometry and camera calibration, e.g., Hartley and Zisserman, "Multiple View Geometry in Computer Vision", 2000, from page 7 for the representation of image pixels as straight lines in space; projection to a 3D model in space as a calculation of the front-most point of intersection of the triangle mesh with the straight line, also referred to as "ray casting"; see also, e.g., the software library "vtk", function "vtkModifiedBSPTree:IntersectWithLine". Alternatively, such a point can also be determined manually, as explained above.

In some exemplary embodiments, certain points such as eye position or pupil position can also be determined by a separate method, for example by means of pupil detection and cornea detection using the images recorded by the camera of FIG. 2. Such determinations are described in the European patent applications EP 3354190 and EP 3355102.

On the basis of the features calculated thus in step 127, frame parameters of the parametric frame model are then calculated in step 128. An example of this calculation is provided below. However, the features can also be used for the frame fitting, described above, on the basis of specific fitting guidelines or for the virtual donning, as described in the European patent application EP 3410178.

In general, for fitting purposes, the features are evaluated in combination in respect of the relative position and/or further properties such as angle or curvature. Some examples of the calculation of the frame parameters in step 128 are described below. These may also serve as an example of the anatomical fitting of step 41 in FIG. 4.

Bridge Width

The bridge width is defined in DIN EN ISO 8624:2015-12, appendix A and emerges from the relative position of the nose pads since the nose pads lie further apart in the case of a greater bridge width and the nose pads lie closer together in the case of a narrower bridge width. In the case of a spectacle frame without nose pads, generalized nose pads are defined as specific regions of the nose rest, which are provided as contact regions with the nose. The bridge width arises as the spacing of the center points of these generalized nose pads. Thus, the bridge width can correspond to a spacing of center points of triangles on both nose wings corresponding to the triangle 132' in FIG. 13D. Here, the geometric centroid, i.e., the point of intersection of the angle bisectors, can be taken as the center point of the triangle.

Figure 16:
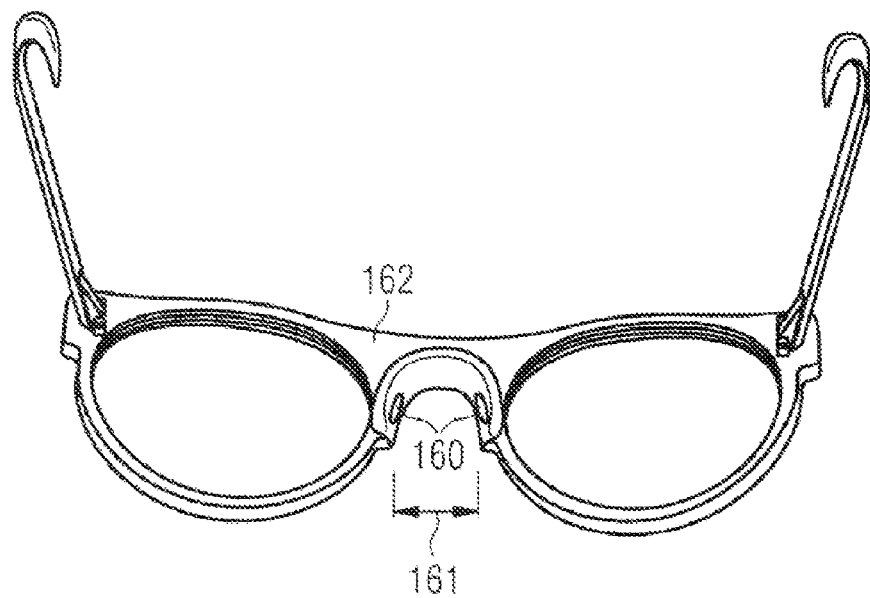
FIG. 16 shows a view of a frame model for elucidating a bridge width.

For elucidation purposes, FIG. 16 shows a perspective view of a parametric frame model with nose pads 160 (within this sense) and the bridge width 161.

Relative Position and Angle of the Nose Pads

Figure 15:
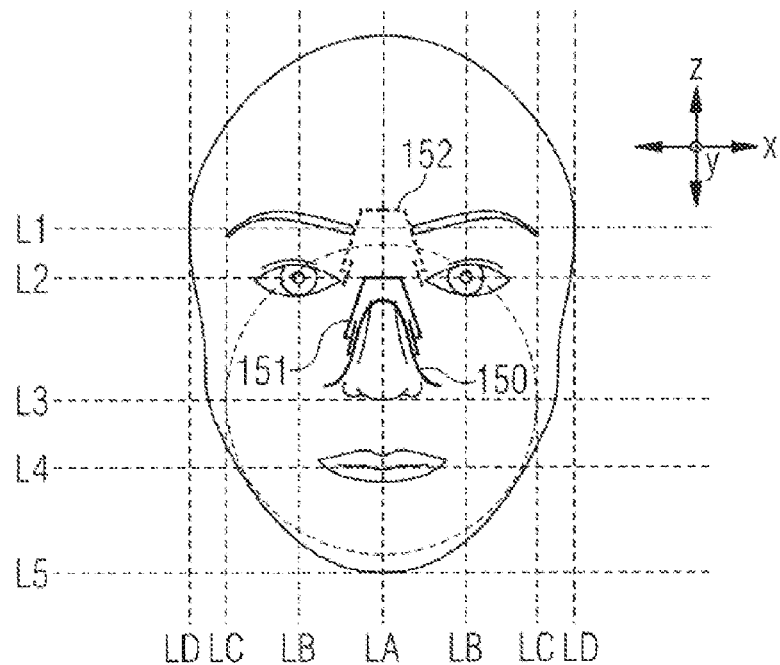
FIG. 15 shows a diagram for elucidating a partial step of fitting a pair of spectacles in the method of FIG. 12.

This fitting is explained in FIG. 15. Here, the nose wings are presented as a cross section. This is represented by a curve 150 and a nose pad 151 is fitted.

Each of the two nose pads can be fitted by a plane that contacts the respective nose pad (tangential plane). As described for other planes above, this plane of the nose pad can be approximated by a reference point $(x_p, y_p, z_p)$ and a normal vector (nx, ny, nz). In particular, the reference point can be a center of the nose pad. In the case of nose pads in the conventional sense, i.e., in the case of metal frames, this center point is defined, e.g., by projection of the centroid of the nose pad on the outer side, i.e., the contact face of the pad with the nose—wherein the pad center can also be part of the parameterizable frame model as a predefined point—i.e., this point is supplied together with the model. In the case of plastic frames without separate pads, the part of the frame envisaged as a contact area for the nose (160 in FIG. 16) is referred to as nose rest or, in generalized fashion here, as a nose pad. Consequently, the two nose pads can likewise be represented as a 12-tuple, with the representation being implemented in the local coordinate system of the frame in the present exemplary embodiment:

$$(x_{[P,OD]}, y_{[P,OD]}, z_{[P,OD]}, nx_{[P,OD]}, ny_{[P,OD]}, nz_{[P,OD]},$$
$$x_{[P,OS]}, y_{[P,OS]}, z_{[P,OS]}, nx_{[P,OS]}, ny_{[P,OS]},$$
$$nz_{[P,OS]})$$

where the index P represents the nose pad.

As explained above, the position and orientation of the nose pads then also imply the bridge width.

In this representation of the nose pads, the coordinate origin and the orientation of the coordinate system can be chosen freely since the 12-tuple is transferable, by way of a common translation mapping to the reference points and a common rotation mapping to reference points and normal vectors, into any desired coordinate system. The precondition is that all parameters of the aforementioned 12-tuple are in fact freely selectable in the parametric frame model. In practice, the parameters are subject to restrictions in a parametric frame model and there are maximum and minimum values for the individual parameters of the parametric frame model (by way of example, a frame cannot be manufactured with an arbitrarily large size or with an arbitrarily large or arbitrarily small bridge width). In any case, both the nose pads and, as mentioned above, the nose wings can be represented as 12-tuples.

Instead of in Cartesian coordinates as above, the normal vectors can be represented in each case by two angles theta and phi in space (substantially a representation in polar coordinates, wherein 1 is selected as a length (radius) of the normal vector:

$$(nx, ny, nz) = (\sin(phi)*\sin(theta), \cos(phi)*\sin(theta), \cos(theta)).$$

Hence, a total of 10 degrees of freedom then arise for the pads (and hence also for the nose bridge) together; a representation as a 10-tuple is obtained:

$$(x_{[P,OD]}, y_{[P,OD]}, z_{[P,OD]}, theta_{OD}, phi_{OD}, x_{[P,OS]}, y_{[P,OS]}, z_{[P,OS]}, theta_{OS}, phi_{OS}) = z_{[P,OS]}$$

The relationship between nose bridge width and the position of the nose pads is evident from FIG. 15: If the nose bridge is widened, there is an increase in the distance between the reference points of the planes of the left and right pad accordingly, and vice versa.

A reduction in the number of parameters occurs if the assumption is made that the bridge is symmetrical and the nose pads are symmetrical with respect to one another. With the yz-plane of FIG. 14 as plane of symmetry, the following applies:

$$x_{[P,OS]} = -x_{[P,OD]} \qquad \text{i.}$$

$$y_{[P,OD]} = y_{[P,OS]} \text{ and } z_{[P,OD]} = z_{[P,OS]} \qquad \text{ii.}$$

$$theta_{[P,OD]} = theta_{[P,OS]} \text{ and } phi_{[P,OD]} = -phi_{[P,OS]} \qquad \text{iii.}$$

Then, (w, $y_P$, $z_P$, theta, phi) arise as free parameters, with theta=$theta_{[P,OD]}$=$theta_{[P,Os]}$ and phi=$phi_{[P,OD]}$=$-phi_{[P,OS]}$. Here, w is the bridge width, where $x_{[P,OD]}$=w/2 and $x_{[P,OS]}$=−w/2 applies. Consequently, 5 free parameters are present in the symmetric case, which free parameters can be used for fitting the parametric frame model. Depending on the frame, fewer degrees of freedom may be present or the degrees of freedom may be restricted by means of specific fitting guidelines, as explained above.

In order to fit the parametric frame model to the 3D model of the head, the planes of the nose pads may be chosen in such a way that they correspond to the planes of the nose wings; i.e., in general, the 12-tuples for the nose pads correspond to the 12-tuple for the nose wings.

By way of example, as a restriction, the position of the bridge or of the nose pads can be fixed in the local coordinate system of the frame (i.e., the values $y_P$, $z_P$ are fixed), or a fixed and, e.g., linear relationship can be chosen between theta and phi such that theta and phi cannot be chosen independently of one another.

In the case of a reduced set of frame parameters, for example in the aforementioned symmetric case, use can be made of averaging. By way of example, if the corresponding angles $theta_{[P,OD]}$ and $theta_{[P,OS]}$ for the nose wings differ, use can be made of a mean value. Should the difference between the angles be greater than a threshold value, a warning to the effect of the symmetric frame form yielding disadvantageous wearing properties in this case can be output. A quality measure that denotes the anatomical fit quality can be used to assess how disadvantageous the wearing properties are. Such a quality measure can be calculated on the basis of the aforementioned distances of the spectacle frame from regions of the head, wherein different distances may be included in the quality measure with different weightings.

Depending on the type of parametric frame, the number of free parameters can be reduced further, for example to two parameters in the region of the nose support, specifically the bridge width and a parameter for the bridge angle. By way of example, the bridge angle is explained in Johannes Eber, "Anatomische Brillenanpassung", Verlag Optische Fachveröffentlichung GmbH, 1987, page 26, FIG. 24 in respect of the bridge angle.

Pantoscopic Angle of the Frame

Moreover, the pantoscopic angle of the frame (also referred to as "as-worn" pantoscopic angle) can be calculated or fitted by means of the features. In exemplary embodiments in which use is made of frame-specific fitting guidelines as explained above, the pantoscopic angle can already be set during this fitting (step 40 in FIG. 4). The latter can then be adapted further in step 128 of FIG. 12. To this end, a distance is calculated between the frame rim (e.g., the back edge of the lower boundary of the frame rim, left or right bottom corner in a frontal view of the frame) and the aforementioned cheek surfaces, which may be represented by a spline surface. Then, the pantoscopic angle is amended in such a way that a predetermined minimum distance, e.g., 2 mm, is ensured.

Earpiece Length

The earpiece length is calculated in step 128 once the fit of the frame on the nose has been set, for example by way of the aforementioned nose pads. For the purposes of setting the earpiece length of the frame (provided this is a free parameter of the parametric frame model), a front resting point of the earpieces is made congruent with the aforementioned points at the base of the ear.

Then, in step 129, the frame parameters calculated in step 128 are applied to the parametric frame model. In step 1210, there is then virtual donning and rendering, as described with reference to step 56 in FIG. 5. Optionally, a further optimization can take place in step 1211, for example an optimization as described in US 2016/0327811 A1, mentioned at the outset, or a manual fitting as described in step 57 in FIG. 5. Then, there is a transfer to the ordering system in step 1212. It is also possible to select further frame parameters, for example a color of the central part of the spectacle frame, a color of the spectacle earpieces of the spectacle frame, material and color of the hinges of the spectacle frame, engravings on the spectacle earpieces of the spectacle frame, design elements, applications to the spectacle earpieces or central part of the spectacle frame. Then, the ordered spectacle frame is manufactured according to the determined parameters, for example using an additive manufacturing method, as explained at the outset.

The foregoing description of the exemplary embodiments of the disclosure illustrates and describes the present invention. Additionally, the disclosure shows and describes only the exemplary embodiments but, as mentioned above, it is to be understood that the disclosure is capable of use in various other combinations, modifications, and environments and is capable of changes or modifications within the scope of the concept as expressed herein, commensurate with the above teachings and/or the skill or knowledge of the relevant art.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

All publications, patents and patent applications cited in this specification are herein incorporated by reference, and for any and all purposes, as if each individual publication, patent or patent application were specifically and individually indicated to be incorporated by reference. In the case of inconsistencies, the present disclosure will prevail.

The invention claimed is:

1. A computer-implemented method for virtual fitting of a spectacle frame, the method comprising:
   providing a 3D model of a person's head;
   providing a parametric head model having second measurement points;
   fitting the parametric head model to the 3D model of the person's head;

determining first measurement points on the 3D model of the person's head by transferring the second measurement points on the parametric head model after the fitting to the 3D model of the person's head to corresponding locations on the 3D model of the person's head; and fitting a model of the spectacle frame to the 3D model of the person's head based on the determined first measurement points, wherein determining the first measurement points comprises projecting the second measurement points onto the 3D model of the head.

2. The method as claimed in claim 1, wherein the second measurement points are defined on a standard head of the parametric head model, and wherein determining the first measurement points includes transferring second features defined on the standard head to the fitted parametric head model in accordance with the fitting.

3. The method as claimed in claim 1, further comprising:
combining a plurality of at least some of the first measurement points to form a feature identifying a region of the 3D model of the person's head.

4. The method as claimed in claim 3, wherein the combining comprises fitting a geometric figure or a function to the plurality of the at least some of the first measurement points.

5. The method as claimed in claim 3, wherein the region of the 3D model comprises a nose wing, a curvature of a forehead, an eyebrow, or a cheek region.

6. The method as claimed in claim 3, wherein the model of the spectacle frame comprises a parametric frame model, and wherein the fitting includes determining one or more parameters of the parametric frame model based on at least one of the first measurement points or the feature.

7. The method as claimed in claim 1, further comprising:
calculating at least one further measurement point for the 3D model based on the first measurement points.

8. The method as claimed in claim 1, wherein the method further comprises:
defining the second measurement points on the parametric head model.

9. A computer-readable non-transitory data medium, on which instructions are stored that, upon execution by a computer, cause the computer to carry out the method as claimed in claim 8.

10. A method for producing a spectacle frame, the method comprising:
carrying out the method as claimed in claim 1; and
producing a spectacle frame based on the fitted model of the spectacle frame.

11. The method as claimed in claim 1, further comprising:
recording a plurality of images of the person's head from different directions to create the 3D model of the person's head.

12. A non-transitory storage medium storing a computer program having a program code which, when executed on a processor, carries out the method as claimed in claim 1.

13. An apparatus comprising a memory, in which the computer program as claimed in claim 12 is stored, and a processor for executing the computer program.

14. An apparatus for data processing, the apparatus comprising:
a processor configured to carry out the method as claimed in claim 1.

15. A computer-implemented method for virtual fitting of a spectacle frame, the method comprising:
providing a 3D model of a person's head;
providing a parametric head model having second measurement points;
fitting the parametric head model to the 3D model of the person's head;
determining first measurement points on the 3D model of the person's head based on the second measurement points defined on the parametric head model;
wherein the second measurement points are defined on a standard head of the parametric head model, and
wherein determining the first measurement points comprises transferring second features defined on the standard head to the fitted parametric head model in accordance with the fitting; and
fitting a model of the spectacle frame to the 3D model of the person's head based on the determined first measurement points,
wherein the parametric head model has a greater smoothness than the 3D model of the person's head.

16. The method as claimed in claim 15, wherein the first measurement points are determined by calculating a point of intersection of a normal vector at a second measurement point with the 3D model of the person's head.

17. A computer-readable non-transitory storage medium comprising instructions that, upon execution by a computer, cause the computer to carry out the method as claimed in claim 15.

18. A non-transitory storage medium storing a computer program having instructions that, upon execution of the program by a computer, cause the computer to carry out the following steps:
providing a 3D model of a person's head;
providing a parametric head model having second measurement points;
fitting the parametric head model to the 3D model of the person's head;
transferring first measurement points on the 3D model of the head based on positions of the second measurement points defined on the parametric head model after the process of fitting the parametric head model to the 3D model of the person's head by projecting the second measurement points onto the 3D model of the head; and
performing at least one of a fitting based on fitting guidelines or an anatomical fitting to fit a model of a spectacle frame to the 3D model of the person's head based on the determined first measurement points.

19. A non-transitory storage medium comprising a computer program having instructions that, upon execution of the program by a computer, cause the computer to carry out the following steps:
providing a 3D model of a person's head;
providing a parametric head model having second measurement points;
fitting the parametric head model to the 3D model of the person's head;
determining first measurement points on the 3D model of the person's head based on the second measurement points defined on the parametric head model,
wherein the second measurement points are defined on a standard head of the parametric head model, wherein determining the first measurement points comprises transferring a second features defined on the standard head to the fitted parametric head model in accordance with the fitting;

fitting a model of a spectacle frame to the 3D model of the person's head based on the determined first measurement points,
wherein determining the first measurement points additionally includes utilizing the transferred second measurement points as the first measurement points or projecting the second measurement points onto the 3D model of the person's head; and
calculating at least one further measurement point for the 3D model based on the first measurement points,
wherein the calculation of the at least one further measurement point includes at least one of a linear combination of a set of first measurement points or am extrapolation based on the first measurement points, and
wherein the parametric head model has a greater smoothness than the 3D model of the person's head.

20. A computer-readable non-transitory storage medium comprising instructions that, upon execution by a computer, cause the computer to carry out the following steps:
providing a 3D model of a person's head;
providing a parametric head model having second measurement points;
fitting the parametric head model to the 3D model of the person's head;
determining an accuracy of the fit of the parametric head model to the 3D model of the person's head;
determining first measurement points on the 3D model of the person's head by transferring the second measurement points defined on the parametric head model;
combining a plurality of at least some of the first measurement points to form a feature identifying a region of the 3D model of the person's head; and
fitting a model of a spectacle frame to the 3D model of the person's head based on the determined first measurement points,
wherein the parametric head model has a greater smoothness than the 3D model of the person's head.

21. A computer-readable non-transitory storage medium comprising instructions that, upon execution by a computer, cause the computer to carry out the following steps:
providing a 3D model of a person's head;
defining second measurement points on a standard head of a parametric head model;
fitting the parametric head model to the 3D model of the person's head;
transferring first measurement points on the 3D model of the person's head based on positions of the second measurement points defined on the parametric head model after the process of fitting the parametric head model to the 3D model of the person's head by projecting the second measurement points onto the 3D model of the head; and
fitting a model of a spectacle frame to the 3D model of the person's head based on the determined first measurement points,
wherein the model of a spectacle frame is a parametric model.

22. An apparatus for data processing, the apparatus comprising:
means for providing a 3D model of a person's head;
means for defining second measurement points on a standard head of a parametric head model;
means for fitting the parametric head model to the 3D model of the person's head;
means for setting first measurement points on the 3D model of the head by transferring the second measurement points defined on the parametric head model after the process of fitting the parametric head model to the 3D model of the head;
providing fitting guidelines of the spectacle frame; and
means for fitting a model of the spectacle frame to the 3D model of the head based on the determined first measurement points and the fitting guidelines,
wherein the parametric head model has a greater smoothness than the 3D model of the person's head.

23. An apparatus for data processing, the apparatus comprising:
means for providing a 3D model of a person's head;
means for providing a parametric head model having second measurement points;
means for fitting a parametric head model to the 3D model of the person's head;
means for determining first measurement points based on the second measurement points defined on the parametric head model, and fitting the parametric head model to the 3D model of the head,
wherein the second measurement points are defined on a standard head of the parametric head model,
wherein the means for determining the first measurement points comprise means for transferring the second features defined on the standard head to the fitted parametric head model in accordance with the fitting,
wherein the means for determining the first measurement points additionally comprise means for projecting the second measurement points onto the 3D model of the head; and
means for fitting a model of a spectacle frame to the 3D model of the head based on the determined first measurement points.

24. A computer-implemented method for virtual fitting of a spectacle frame, the method comprising:
providing a 3D model of a person's head;
defining second measurement points on a standard head of a parametric head model;
fitting the parametric head model to the 3D model of the person's head;
determining first measurement points on the 3D model of the head based on positions of the second measurement points defined on the parametric head model after the process of fitting the parametric head model to the 3D model of the head, wherein the first measurement points and the second measurement points have the same spatial coordinates, respectively;
determining an accuracy of the fit of the parametric head model to the 3D model of the person's head;
setting the first measurement points having the spatial coordinates of the second measurement points as the determined first measurement points if the accuracy of the fit is below a threshold value and setting the first measurement points having adjusted spatial coordinates as the determined first measurement points if the accuracy of the fit is or exceeds the threshold value;
providing fitting guidelines of the spectacle frame; and
fitting a model of the spectacle frame to the 3D model of the person's head based on the determined first measurement points.

25. The method as claimed in claim 24, wherein setting the first measurement points includes transferring second features defined on the standard head to the fitted parametric head model in accordance with the fitting.

26. The method as claimed in claim 24, wherein setting the first measurement points comprises transferring the second measurement points and utilizing the transferred second measurement points as the first measurement points.

27. The method as claimed in claim 24, wherein setting the first measurement points comprises projecting the second measurement points onto the 3D model of the person's head.

28. A non-transitory storage medium storing a computer program having instructions that, upon execution of the program by a computer, cause the latter to carry out the method as claimed in claim 24.

29. A non-transitory storage medium storing a computer program having instructions that, upon execution of the program by a computer, cause the computer to carry out the following steps:
providing a 3D model of a person's head;
defining second measurement points on a standard head of a parametric head model;
fitting the parametric head model to the 3D model of the person's head;
determining first measurement points on the 3D model of the head based on positions of the second measurement points defined on the parametric head model, wherein the first measurement points and the second measurement points have the same spatial coordinates, respectively;
determining an accuracy of the fit of the parametric head model to the 3D model of the person's head;
setting the first measurement points having the spatial coordinates of the second measurement points as the determined first measurement points if the accuracy of the fit is below a threshold value and setting the first measurement points having adjusted spatial coordinates as the determined first measurement points if the accuracy of the fit is or exceeds the threshold value;
determining first measurement points on the 3D model of the person's head based on the second measurement points defined on the parametric head model;
providing fitting guidelines of the spectacle frame; and
fitting a model of a spectacle frame to the 3D model of the person's head based on the determined first measurement points.

30. An apparatus for data processing, comprising a memory, in which the computer program as claimed in claim 29 is stored, and a processor for executing the computer program.

31. A computer-readable non-transitory storage medium comprising instructions that, upon execution by a computer, cause the computer to carry out the following steps:
providing a 3D model of a person's head;
providing a parametric head model having second measurement points;
fitting the parametric head model to the 3D model of the person's head;
determining an accuracy of the fit of the parametric head model to the 3D model of the person's head;
determining first measurement points on the 3D model of the person's head based on second measurement points defined on the parametric head model, wherein the first measurement points and the second measurement points have the same spatial coordinates, respectively; and
setting the first measurement points having the spatial coordinates of the second measurement points as the determined first measurement points if the accuracy of the fit is below a threshold value and setting the first measurement points having adjusted spatial coordinates as the determined first measurement points if the accuracy of the fit is or exceeds the threshold value; and
fitting a model of a spectacle frame to the 3D model of the person's head based on the determined first measurement points,
wherein determining the first measurement points additionally comprises utilizing the transferred second measurement points as the first measurement points or projecting the second measurement points onto the 3D model of the person's head, and
wherein fitting the model of the spectacle frame to the 3D model of the person's head includes deforming the model of the spectacle frame.

32. An apparatus for data processing, the apparatus comprising:
means for providing a 3D model of a person's head,
means for providing a parametric head model having second measurement points;
means for fitting the parametric head model to the 3D model of the person's head;
means for determining first measurement points based on the second measurement points defined on the parametric head model, wherein the first measurement points and the second measurement points have the same spatial coordinates, respectively;
means for determining an accuracy of the fit of the parametric head model to the 3D model of the person's head;
means for setting the first measurement points having the spatial coordinates of the second measurement points as the determined first measurement points if the accuracy of the fit is below a threshold value and setting the first measurement points having adjusted spatial coordinates as the determined first measurement points if the accuracy of the fit is or exceeds the threshold value; and
means for fitting a model of a spectacle frame to the 3D model of the head based on the determined first measurement points.

\* \* \* \* \*

UNITED STATES PATENT AND TRADEMARK OFFICE
CERTIFICATE OF CORRECTION

| | |
|---|---|
| PATENT NO. | : 11,915,381 B2 |
| APPLICATION NO. | : 16/731402 |
| DATED | : February 27, 2024 |
| INVENTOR(S) | : Oliver Schwarz and Ivo Ihrke |

It is certified that error appears in the above-identified patent and that said Letters Patent is hereby corrected as shown below:

On the Title Page

In Other Publications, Column 1, Line 4: change "Zollhofer" to -- Zollhöfer -- and "Gunther" to -- Günther -- and "Sußmuth" to -- Süßmuth --

In the Specification

In Column 5, Line 23: change "NieBner" to -- Nießner --

In Column 5, Line 24: change "Zollhofer" to -- Zollhöfer --

In Column 11, Line 60: change "Hirschmuller" to -- Hirschmüller --

In the Claims

In Column 29, Line 13, Claim 19: change "am" to -- an --

Signed and Sealed this
Sixteenth Day of July, 2024

Katherine Kelly Vidal
*Director of the United States Patent and Trademark Office*